(12) United States Patent
Wang et al.

(10) Patent No.: US 12,002,842 B2
(45) Date of Patent: Jun. 4, 2024

(54) LIGHT EMITTING DEVICE AND MANUFACTURING METHOD THEREOF

(71) Applicant: EPISTAR CORPORATION, Hsinchu (TW)

(72) Inventors: Hsin Ying Wang, Hsinchu (TW); Tzung Shiun Yeh, Hsinchu (TW); Yu Ling Lin, Hsinchu (TW); Bo Jiun Hu, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 195 days.

(21) Appl. No.: 16/942,858

(22) Filed: Jul. 30, 2020

(65) Prior Publication Data

US 2021/0036049 A1 Feb. 4, 2021

(30) Foreign Application Priority Data

Jul. 31, 2019 (TW) .................................. 108127238

(51) Int. Cl.
*H01L 27/15* (2006.01)
*H01L 33/44* (2010.01)
*H01L 33/38* (2010.01)

(52) U.S. Cl.
CPC ............ *H01L 27/156* (2013.01); *H01L 33/44* (2013.01); *H01L 33/38* (2013.01)

(58) Field of Classification Search
CPC ....... H01L 27/156; H01L 33/44; H01L 33/38; H01L 33/62; H01L 27/153; H01L 33/0095
See application file for complete search history.

(56) References Cited

U.S. PATENT DOCUMENTS

| 6,635,902 | B1 * | 10/2003 | Lin | ...................... | H01L 25/0753 257/E25.02 |
| 6,869,812 | B1 * | 3/2005 | Liu | ......................... | H01L 33/24 257/E33.072 |
| 7,732,825 | B2 * | 6/2010 | Kim | ......................... | H01L 27/15 257/E21.381 |
| 2005/0253151 | A1 * | 11/2005 | Sakai | ...................... | H01L 33/62 257/79 |
| 2005/0254243 | A1 * | 11/2005 | Jiang | ...................... | H01L 27/156 315/246 |
| 2010/0059768 | A1 * | 3/2010 | Hasnain | ................ | H01L 27/153 438/34 |
| 2010/0167434 | A1 | 7/2010 | Fang et al. | | |

(Continued)

FOREIGN PATENT DOCUMENTS

| CN | 208596700 U | 3/2019 |
| CN | 104638084 B | 7/2019 |

(Continued)

*Primary Examiner* — Su C Kim
(74) *Attorney, Agent, or Firm* — Patterson + Sheridan, LLP

(57) ABSTRACT

A light-emitting diode, includes a substrate; a semiconductor stack formed on the substrate; a first current blocking patterned structure and a second current blocking patterned structure formed on the semiconductor stack and separated from each other; and a plurality of electrodes formed on the semiconductor stack and electrically connected to the semiconductor stack; wherein the first current blocking patterned structure is overlapped with one of the plurality of electrodes and the second current blocking patterned structure is not overlapped with the plurality of electrodes.

20 Claims, 17 Drawing Sheets

(56) References Cited

U.S. PATENT DOCUMENTS

| | | | |
|---|---|---|---|
| 2010/0224858 A1* | 9/2010 | Tu .......................... | H01L 33/44 |
| | | | 257/14 |
| 2011/0204387 A1* | 8/2011 | Kim ..................... | H01L 27/156 |
| | | | 257/E33.072 |
| 2015/0333241 A1* | 11/2015 | Chen ..................... | H01L 27/156 |
| | | | 257/93 |
| 2016/0225816 A1 | 8/2016 | Choi et al. | |
| 2017/0069682 A1* | 3/2017 | Chen ..................... | H01L 33/60 |

FOREIGN PATENT DOCUMENTS

| | | |
|---|---|---|
| TW | I572057 B | 2/2017 |
| TW | 202015257 A | 4/2020 |

\* cited by examiner

LIGHT EMITTING DEVICE AND MANUFACTURING METHOD THEREOF

CROSS-REFERENCE TO RELATED APPLICATIONS

This application claims priority to the benefit of Taiwan Patent Application Number 108127238 filed on Jul. 31, 2019, and the entire contents of which are hereby incorporated by reference herein in its entirety.

BACKGROUND

Technical Field

The present disclosure relates to a light emitting device, more specifically, to a light emitting device with current blocking patterned structures.

Description of the Related Art

The light emitting diodes (LEDs) have the characteristics of low power consumption, low heat-generation, long lifetime, shockproof, compact size, and high response speed. Thus, the LEDs are suitable for various lighting applications and display applications.

A conventional LED includes compound semiconductor materials. Holes from the p-type semiconductor layer and electrons from the n-type semiconductor layer are combined to generate photons, thereby emitting light. In conventional LEDs, current crowding is likely to occur near the electrodes. Therefore, transparent conductive layer and current blocking patterned structure are formed in some LEDs to make the current distribution more even to improve luminous efficiency.

SUMMARY OF THE DISCLOSURE

A light emitting device, includes a substrate; a semiconductor stack formed on the substrate; a first current blocking patterned structure and a second current blocking patterned structure formed on the semiconductor stack and separated from each other; and a plurality of electrodes formed on the semiconductor stack and electrically connected to the semiconductor stack; wherein the first current blocking patterned structure is overlapped with one of the plurality of electrodes and the second current blocking patterned structure is not overlapped with the plurality of electrodes.

A light emitting device, includes a substrate including a first edge and a second edge opposite to the first edge; a semiconductor stack formed on the substrate; a first current blocking patterned structure and a second current blocking patterned structure formed on the semiconductor stack and separated from each other; and an electrode formed on the semiconductor stack and the first current blocking patterned structure; wherein the first current blocking patterned structure is flush with the first edge, and the second current blocking patterned structure is flush with the second edge.

A light emitting device, includes a substrate comprising a top surface, a first edge, and a second edge opposite to the first edge; a semiconductor stack formed on the substrate; a first current blocking patterned structure formed on the semiconductor stack; and a first electrode formed on the first current blocking patterned structure; wherein the top surface includes a periphery region surrounding the semiconductor stack in a top view of the light emitting device, and wherein the first current blocking patterned structure covers the periphery region partially.

DETAILED DESCRIPTION OF THE EMBODIMENTS

Figure 1:
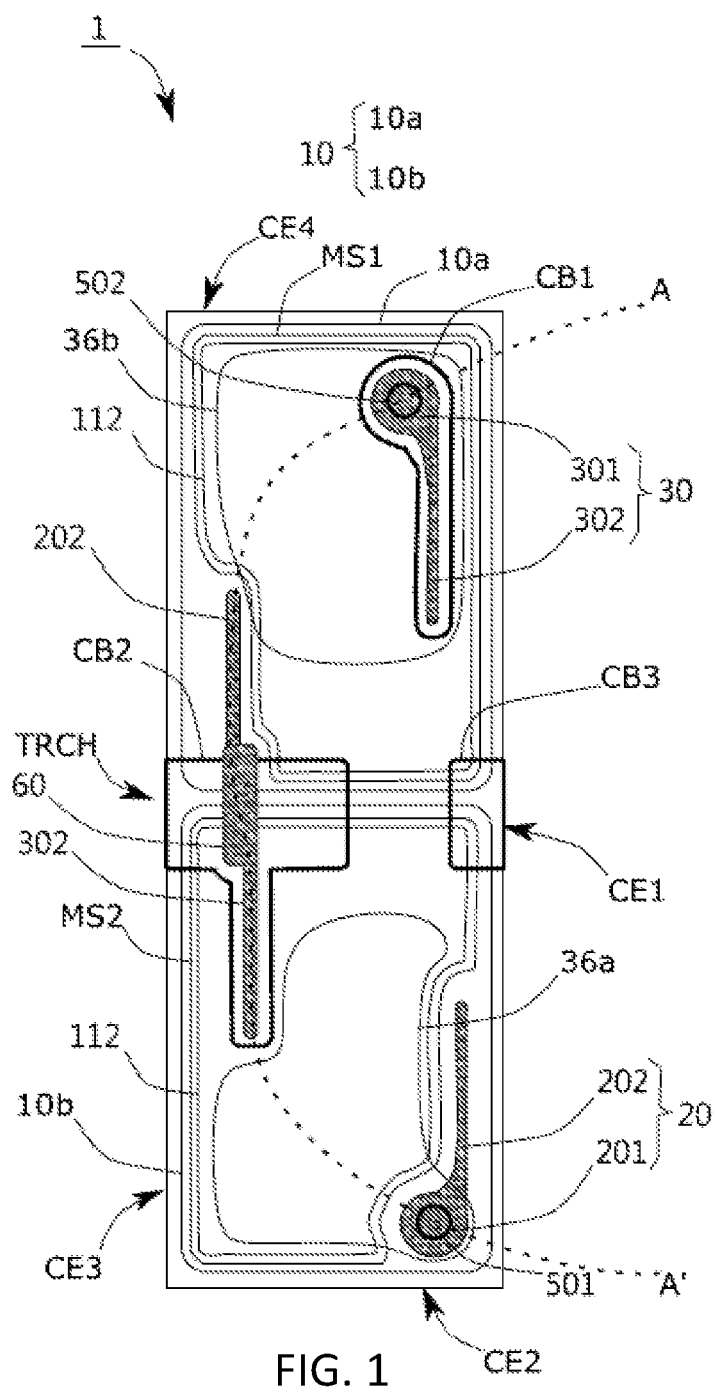
FIG. 1 shows a top view of the light emitting device 1 in accordance with the first embodiment of the present application.

Exemplary embodiments of the present application will be described in detail with reference to the accompanying drawings hereafter. The following embodiments are given by way of illustration to help those skilled in the art fully understand the spirit of the present application. Hence, it should be noted that the present application is not limited to the embodiments herein and can be realized by various forms. Further, the drawings are not precise scale and components may be exaggerated in view of width, height, length, etc. Herein, the similar or identical reference numerals will denote the similar or identical components throughout the drawings.

First Embodiment

Figure 2:
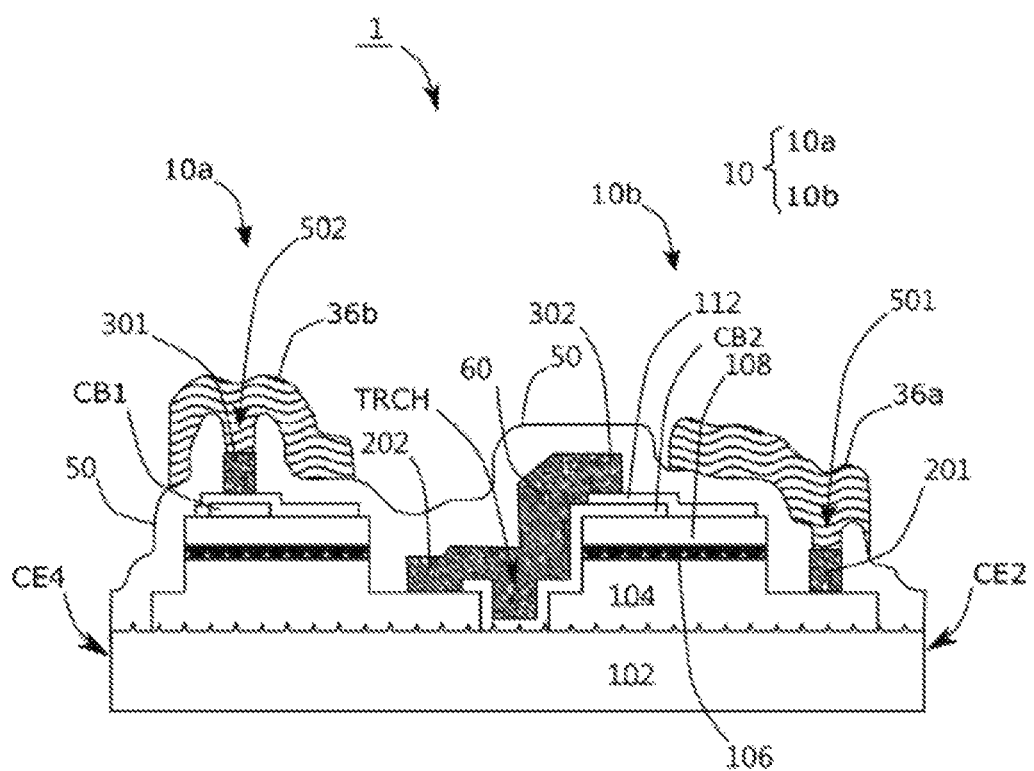
FIG. 2 shows a cross-sectional view of the light emitting device 1.

FIG. 1 shows a top view of the light emitting device 1 in accordance with the first embodiment of the present application. FIG. 2 shows a cross-sectional view of the light emitting device 1.

As shown in FIG. 1 and FIG. 2, the light emitting device 1 includes a plurality of light emitting units 10(10a, 10b) formed on a substrate 102, each of the light emitting units includes a first semiconductor layer 104, an active layer 106, a second semiconductor layer 108, a plurality of current blocking patterned structures CB1, CB2, CB3, transparent conductive layer 112, a first electrode 20, a second electrode 30 and a connection electrode 60. The connection electrode 60 electrically connects the light emitting units 10 in series and/or parallel to form an LED array, and pads 36a and 36b connect to an external power supply or external components in flip-chip form.

FIGS. 3A-3H show cross-sectional views of the light emitting device 1 in corresponding manufacturing step. FIGS. 4A-4H show top views of the light emitting device 1 in corresponding manufacturing step.

Figure 3A:
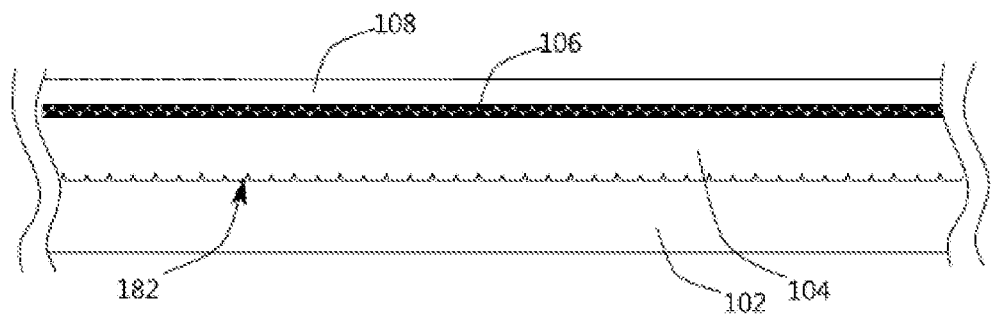
FIGS. 3A-3H show cross-sectional views of the light emitting device 1 in corresponding manufacturing step.

Referring to FIG. 3A, the substrate 102 can be a growth substrate, including a substrate for growing AlGaInP semiconductor thereon, such as GaAs substrate or GaP substrate, or a substrate for growing InGaN or AlGaN thereon, such as sapphire substrate, GaN substrate, SiC substrate, or AlN substrate. In an embodiment, the substrate 102 is a transparent sapphire substrate having a plurality of patterned structures on a top surface 182 thereof. In another embodiment, the top surface 182 of the substrate 102 can be a flat surface. The first semiconductor layer 104, the active layer 106, and the second semiconductor layer 108 are sequentially stacked on the top surface 182 of the substrate 102 to form a semiconductor stack. In an embodiment of the present application, the semiconductor stack is formed on the substrate 102 by epitaxy such as metal-organic chemical vapor deposition (MOCVD), molecular beam epitaxy (MBE), hydride vapor epitaxy (HVPE), or physical vapor deposition such as sputtering or evaporating.

In an embodiment, the semiconductor stack includes a buffer structure (not shown) between the first semiconductor layer 104 and the substrate 102. The buffer structure can reduce the lattice mismatch and suppress dislocation, thereby improving the epitaxial quality. The material of the buffer structure includes GaN, AlGaN, or AlN. In an embodiment, the buffer structure includes a plurality of sub-layers (not shown). The sub-layers include the same material or different materials. In an embodiment, the buffer structure includes two sub-layers, wherein a first sub-layer thereof is grown by sputtering and a second sub-layer thereof is grown by MOCVD. In another embodiment, the buffer structure further includes a third sub-layer. The third sub-layer is grown by MOCVD, and the growth temperature of the second sub-layer is higher or lower than the growth temperature of the third sub-layer. In an embodiment, the first, second, and third sub-layers include the same material, such as AlN. In an embodiment of the present application, the first semiconductor layer 104 and the second semiconductor layer 108 are, for example, a cladding layer or a confinement layer having different conductivity types, different electrical properties, different polarities, or different dopants for providing electrons or holes. For example, the first semiconductor layer 104 is an n-type semiconductor and the second semiconductor layer 108 is a p-type semiconductor. The active layer 106 is formed between the first semiconductor layer 104 and the second semiconductor layer 108. Driven by a current, electrons and holes are combined in the active layer 106 to convert electrical energy into optical energy for illumination. The wavelength of the light emitted by the light emitting device 1 or the semiconductor stack can be adjusted by changing the physical properties and chemical composition of one or more layers in the semiconductor stack.

The material of the semiconductor stack includes III-V semiconductor like $Al_xIn_yGa_{(1-x-y)}N$ or $Al_xIn_yGa_{(1-x-y)}P$, where $0 \leq x, y \leq 1; x+y \leq 1$. When the material of the semiconductor stack includes AlInGaP, it emits red light having a wavelength between 610 nm and 650 nm or yellow light having a wavelength between 550 nm and 570 nm. When the material of the semiconductor stack includes InGaN, it emits blue light or deep blue light having a wavelength between 400 nm and 490 nm or green light having a wavelength between 490 nm and 550 nm. When the material of the semiconductor stack includes AlGaN, it emits UV light having a wavelength between 250 nm and 400 nm. The active layer 106 can be a single hetero-structure (SH), a double hetero-structure (DH), a double-side double hetero-structure (DDH), or a multi-quantum well (MQW). The material of the active layer 106 can be i-type, p-type, or n-type.

Figure 3B:
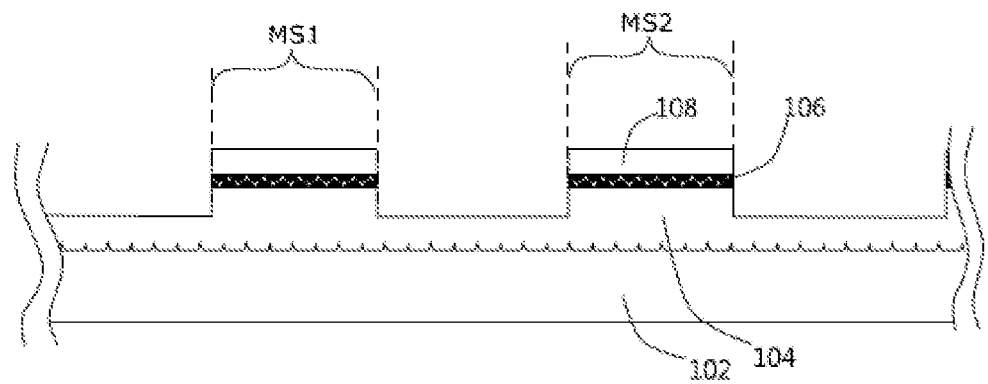
Figure 4A:
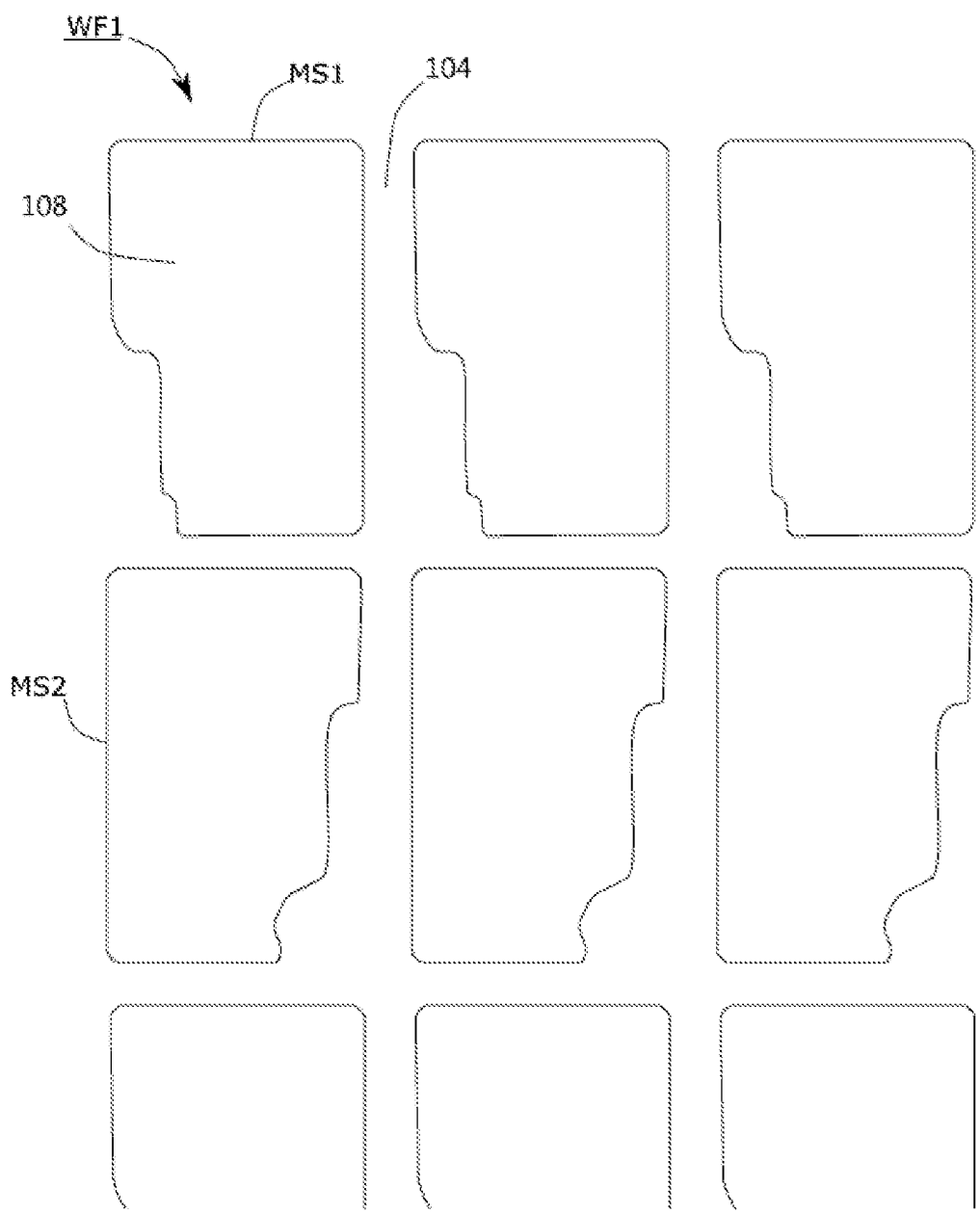
FIGS. 4A-4H show top views of the light emitting device 1 in corresponding manufacturing step.

Next, as shown in FIG. 3B and FIG. 4A, mesas MS1, MS2 are formed after etching the semiconductor stack, the mesas MS1, MS2 are separated from each other. In the present application, for the sake and ease of illustration, not all elements and blocks are marked with numerals. Those skilled in the art can infer according to the teaching of the present application. For example, in FIG. 4A, only two mesas MS1, MS2 are marked, while the others having the same outline as the mesas MS1, MS2 without numerals are also the mesas. The area outside the mesas exposes the first semiconductor 104 as shown in FIG. 3B.

Figure 3C:
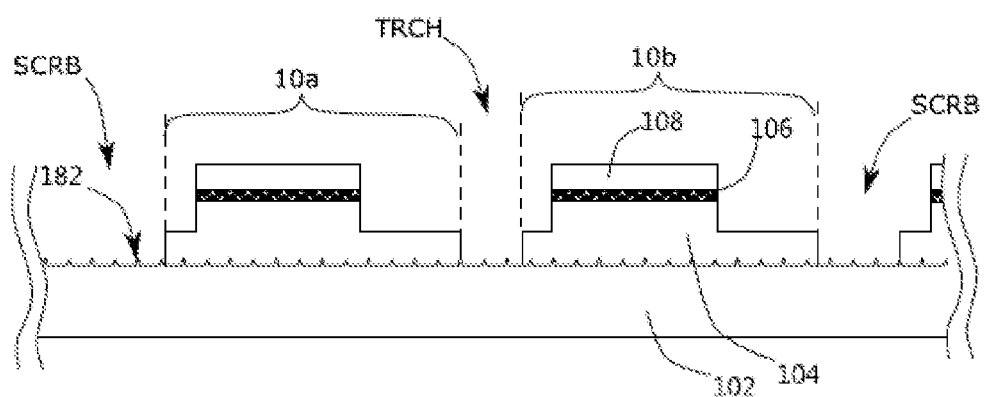
Figure 4B:
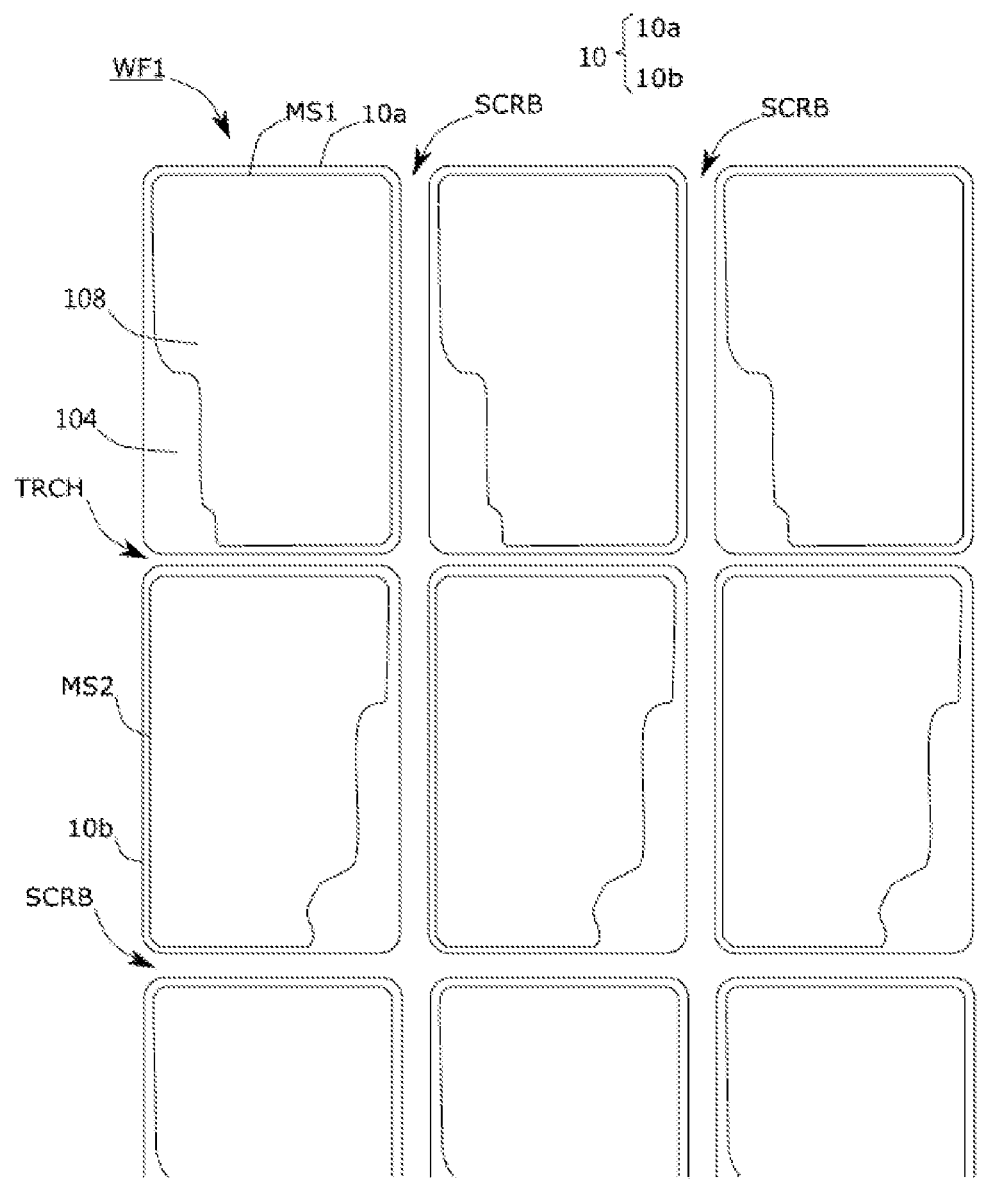

Next, referring to FIG. 3C and FIG. 4B, the light emitting units 10(10a, 10b) are formed after etching the semiconductor stack on the wafer WF1, the light emitting units 10(10a, 10b) are separated from each other. As shown in FIG. 4B, the light emitting units 10a, 10b respectively include the mesas MS1, MS2. The area outside the light emitting units 10 exposes the top surface 182 of the substrate 102. As shown in FIG. 3C, the area between the light emitting units 10 includes a trench TRCH formed by side walls of the semiconductor stacks of the two adjacent light emitting units 10 and the top surface 182 of the substrate 102. In the following process, the light emitting device 1 is formed after finishing the electrical connection of the light emitting units 10, and then a dicing separation process is performed on the wafer WF1 to separate each light emitting device 1. Therefore, the trench TRCH around each light emitting device 1 is used as a scribe line SCRB in the dicing separation process.

Figure 3D:
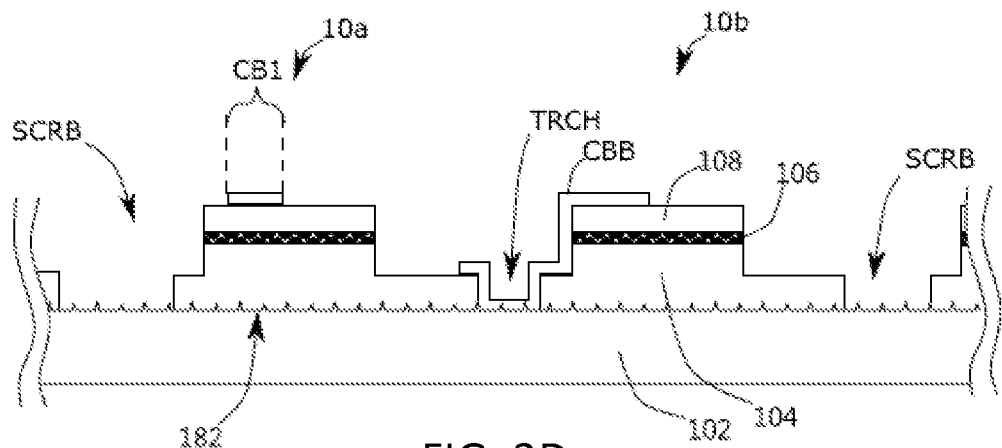
Figure 4C:
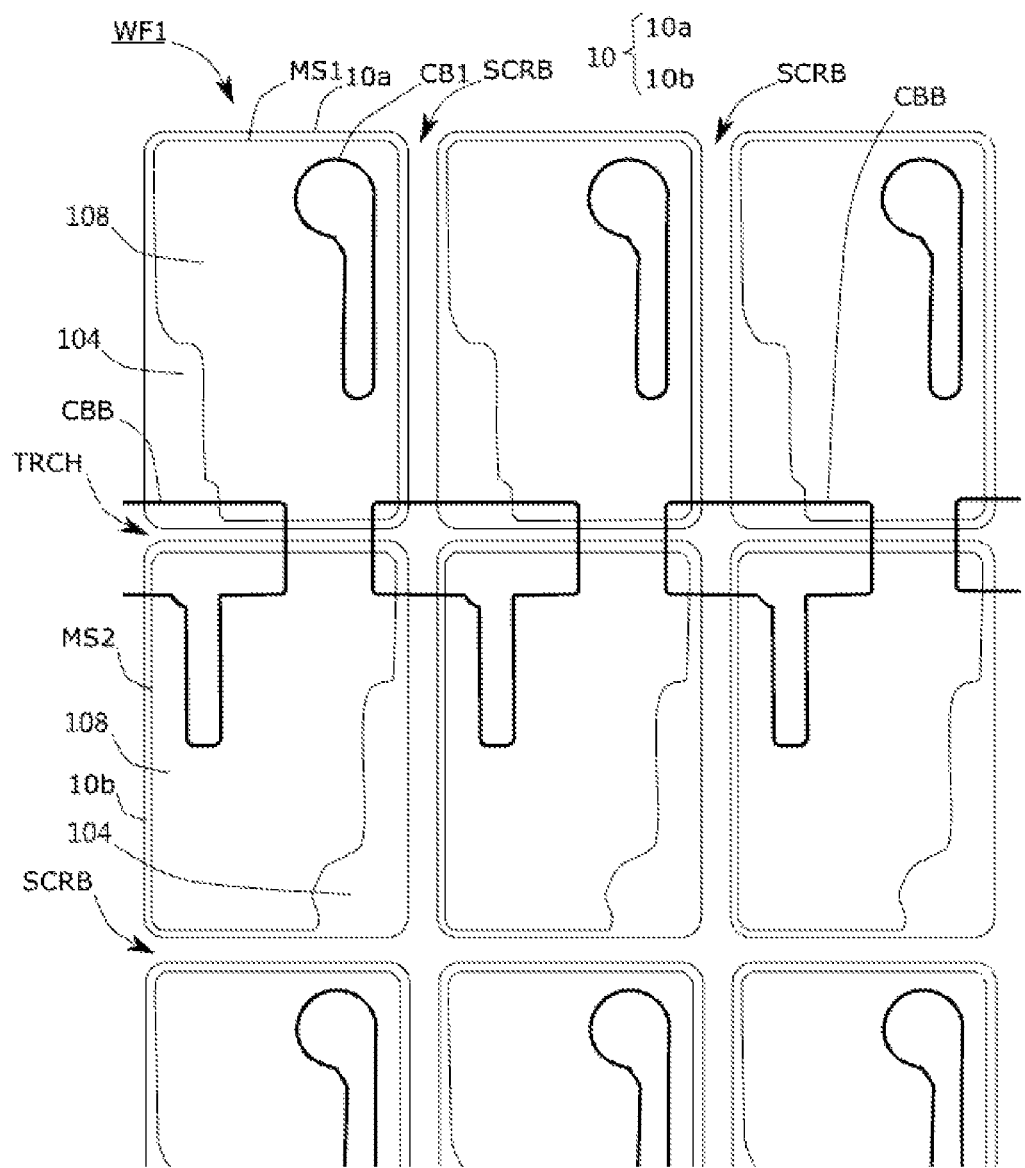

Referring to FIG. 3D and FIG. 4C, current blocking patterned structures CB1, CBB are formed on the light emitting unit 10 and the trench TRCH. For example, the forming method of the current blocking patterned structures CB1, CBB includes depositing an insulative layer (not shown) on the light emitting unit 1, wherein the material of the insulative layer can be silicon oxide, silicon nitride, silicon oxynitride, titanium oxide, aluminum oxide, a combination thereof or a stack laminated by any of the above materials. The insulative layer may be a single layer or a stack of multiple layers. The insulative layer can also be a distributed Bragg reflector including alternate stacks of insulating materials with different refractive indexes. Next, a step of patterning the insulative layer is performed, and the insulative layer can be patterned by lithography process and etching process to obtain the current blocking patterned structures CB1, CBB as shown in FIG. 3D and FIG. 4C. The current blocking patterned structure CB1 is on the second semiconductor layer 108 of the light emitting unit 10a. The current blocking patterned structure CBB is on the trench TRCH, covers the top surface 182 of the substrate 102 in the trench TRCH and extends to the side wall of the semiconductor stack of the light emitting unit 10 and a part of the second semiconductor layer 108.

Figure 3E:
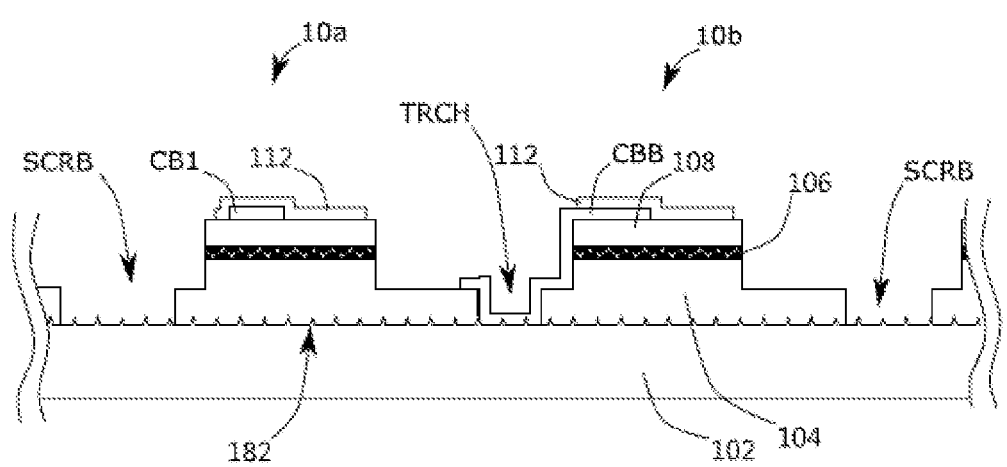
Figure 4D:
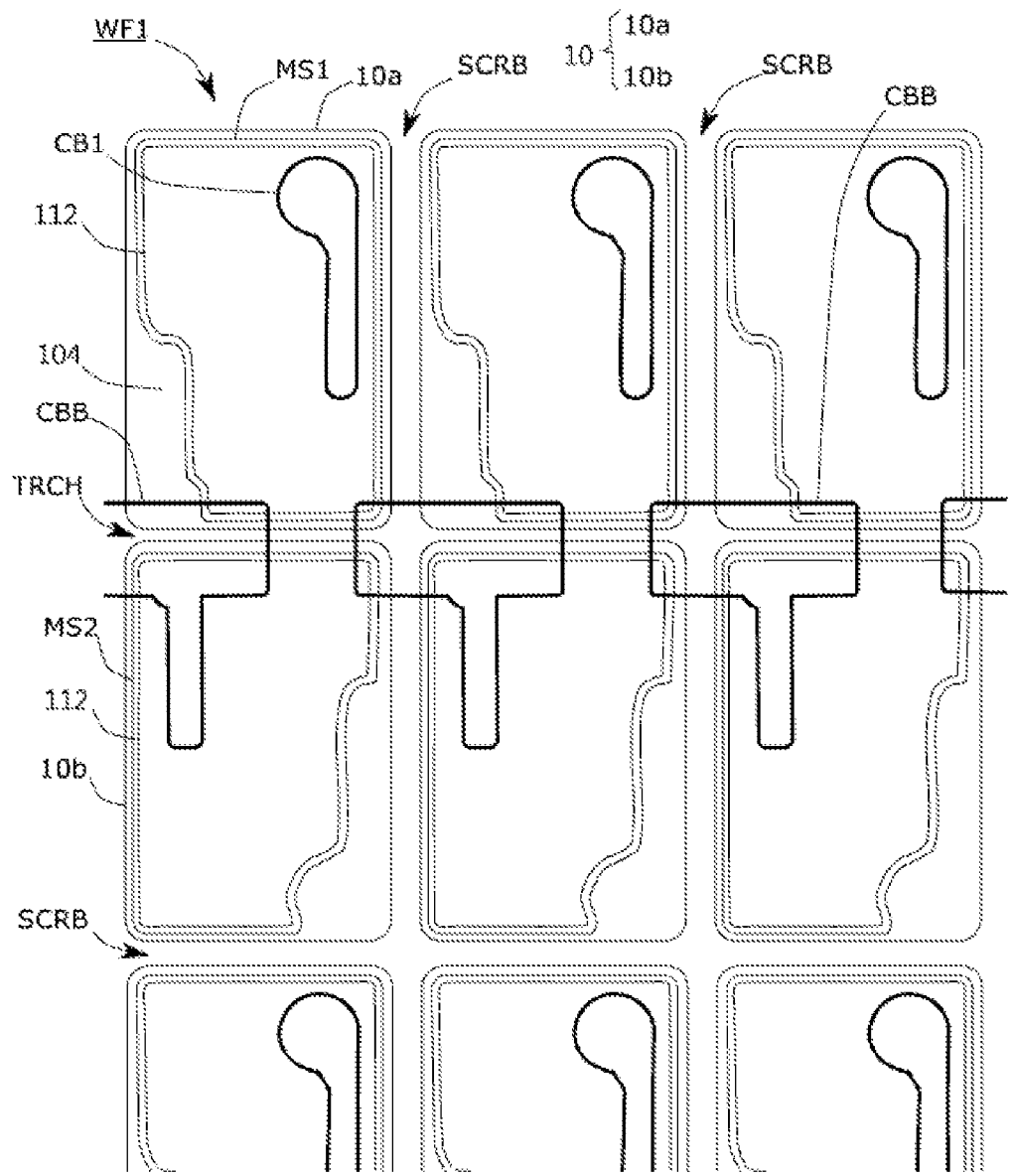

Next, as shown in FIG. 3E and FIG. 4D, the transparent conductive layer 112 is formed on the light emitting unit 10. The transparent conductive layer 112 covers the current blocking patterned structure CB1 and a part of the current blocking patterned structure CBB. In FIG. 4D, from a top view, the transparent conductive layer 112 on each light emitting unit 10 is relatively indented corresponding to the mesas MS1, MS2. Therefore, a boundary of the transparent conductive layer 112 is kept at a fixed distance from a boundary of the mesas MS1, MS2. This is only an example, and the present application is not limited to this. The material of the transparent conductive layer 112 includes metal or transparent conductive oxide material. The transparent conductive layer 112 can be a thin film with high transparency made of metal. The transparent conductive oxide material is transparent to the light emitted from the active layer 106, such as indium tin oxide (ITO), zinc oxide (ZnO), aluminum zinc oxide (AZO), gallium zinc oxide (GZO), indium zinc oxide (IZO).

Figure 3F:
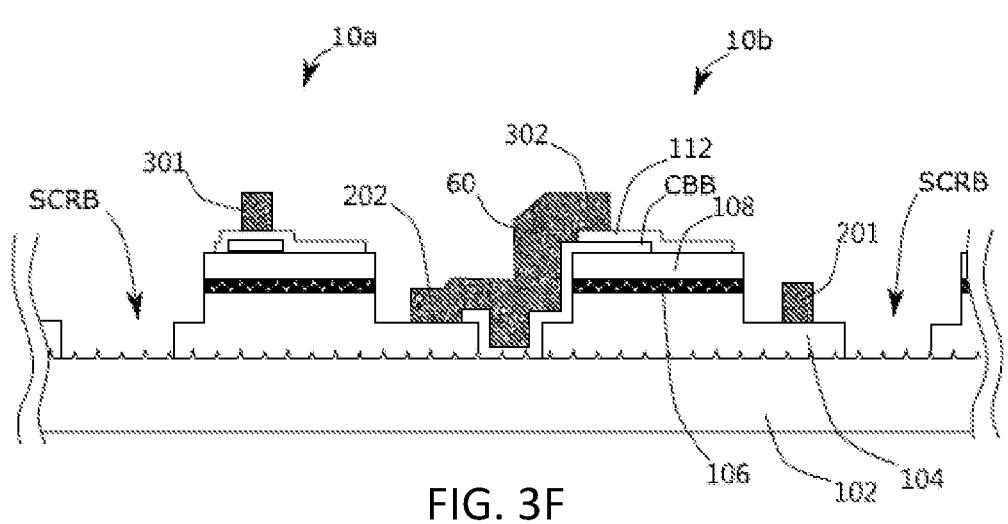
Figure 4E:
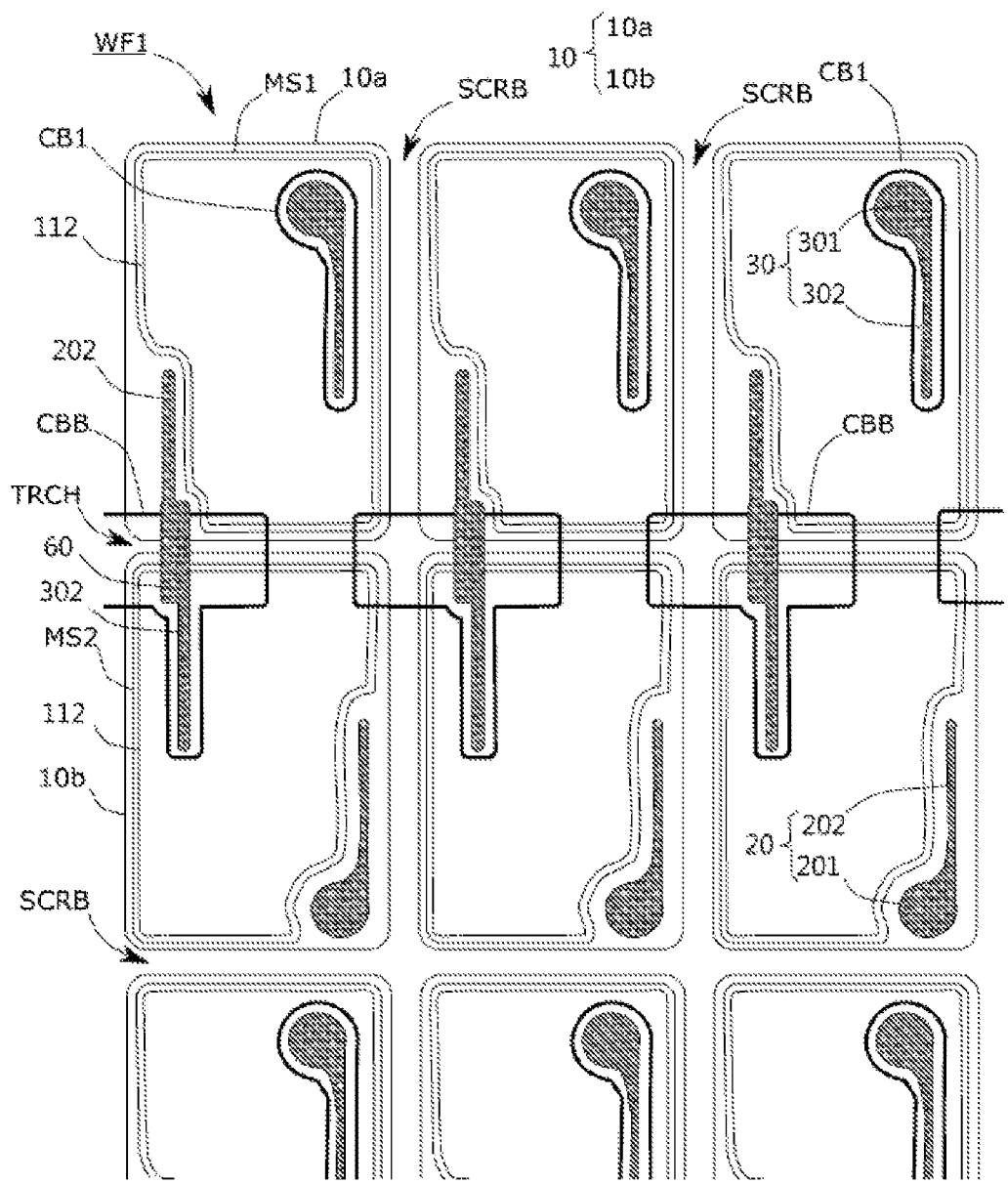

Referring to FIG. 3F and FIG. 4E, an electrode layer is formed on the light emitting unit 10, and the electrode layer is patterned to form the first electrode 20, the second electrode 30 and the connection electrode 60. The material of the electrode layer includes metal, such as Cr, Ti, Au, Al, Cu, Sn, Ni, Rh, Pt, an alloy thereof or a stack laminated by any of the above materials. The first electrode 20 is formed on the first semiconductor layer 104 of the light emitting unit 10b and includes a first contact portion 201 and a first extension portion 202 extending form the first contact portion 201. The first electrode 20 is electrically connected to the first semiconductor layer 104. The second electrode 30 is formed on the transparent conductive layer 112 of the light emitting unit 10a to electrically connect to the transparent conductive layer 112 and the second semiconductor layer 108, and includes a second contact portion 301 and a second extension portion 302 extending form the second contact portion 301. Each of the light emitting unit 10 is provided with the first extension portion 202 electrically connected to the first semiconductor layer 104 and the second extension portion 302 electrically connected to the second semiconductor layer 108. The connection electrode 60 is formed on the current blocking patterned structure CBB, and connects the first extension portion 202 on the light emitting unit 10 and the second extension portion 302 on the adjacent light emitting unit 10, so that the light emitting units 10 forms a serial-connecting LED array. In another embodiment, the connection electrode 60 connects the first extension portions 202 on two adjacent light emitting units 10, and/or the connection electrode 60 connects the second extension portions 302 on two adjacent light emitting units 10, so that the light emitting units 10 are connected in parallel LED array or series-parallel LED array.

Figure 3G:
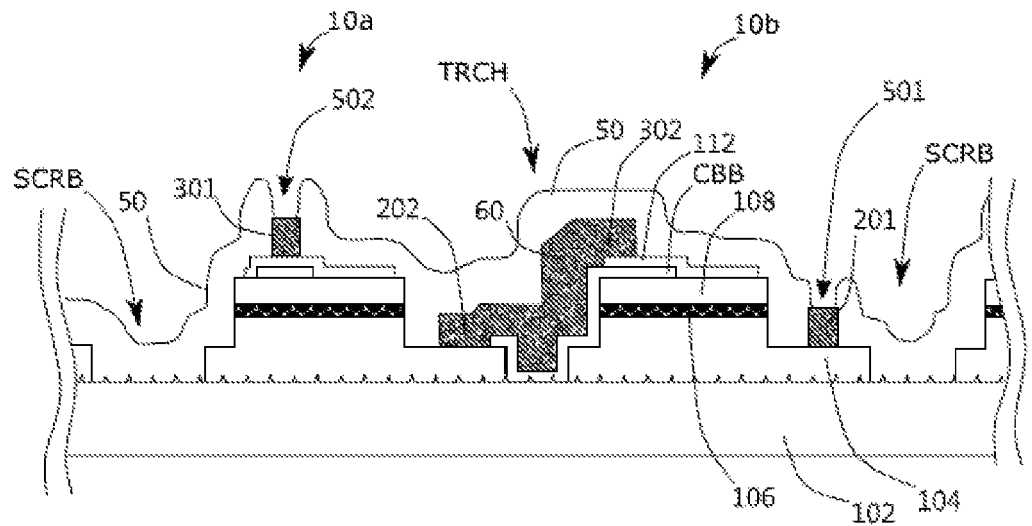
Figure 4F:
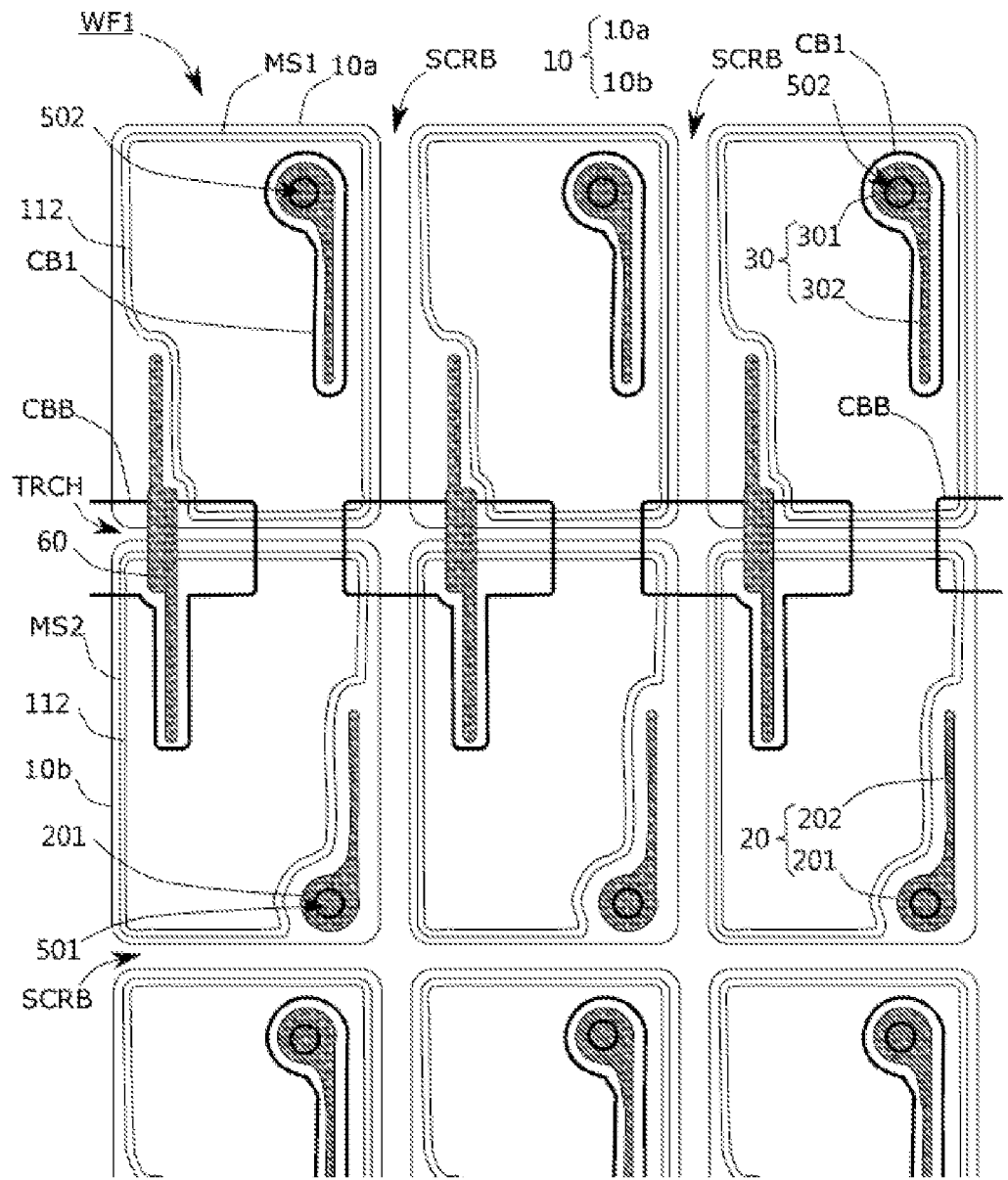

Next, as shown in FIG. 3G and FIG. 4F, an insulating structure 50 is formed on the light emitting units 10 and the trench TRCH, and the insulating structure 50 is patterned and includes openings 501, 502 respectively corresponding to the first contact portion 201 and the second contact portion 301. The material of the insulating structure 50 includes silicon oxide, silicon nitride, silicon oxynitride, titanium oxide, aluminum oxide, a combination thereof or a stack laminated by any of the above materials. The insulating structure 50 may be a single layer or a stack of multiple layers. In an embodiment, the insulating structure 50 is a distributed Bragg reflector including alternate stacks of insulating materials with different refractive indexes. For flip-chip structure, the light output of the light emitting surface of the light emitting device 1 can be increased. In another embodiment, a surface opposite to the top surface 182 of the substrate 102, that is, the bottom surface of the substrate 102, includes a reflective layer (not shown) formed thereon. The reflective layer may be a distributed Bragg reflector including alternate stacks of insulating materials with different refractive indexes.

Figure 3H:
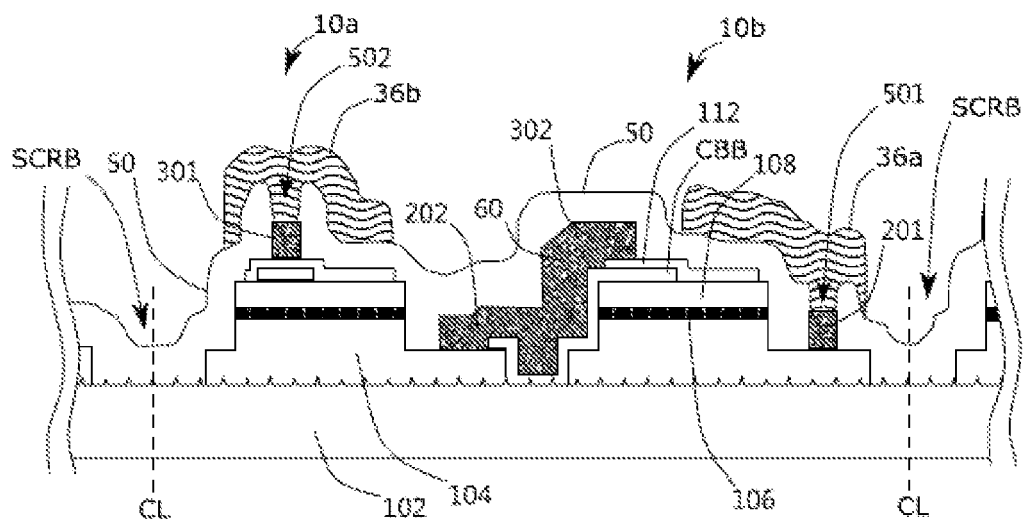
Figure 4G:
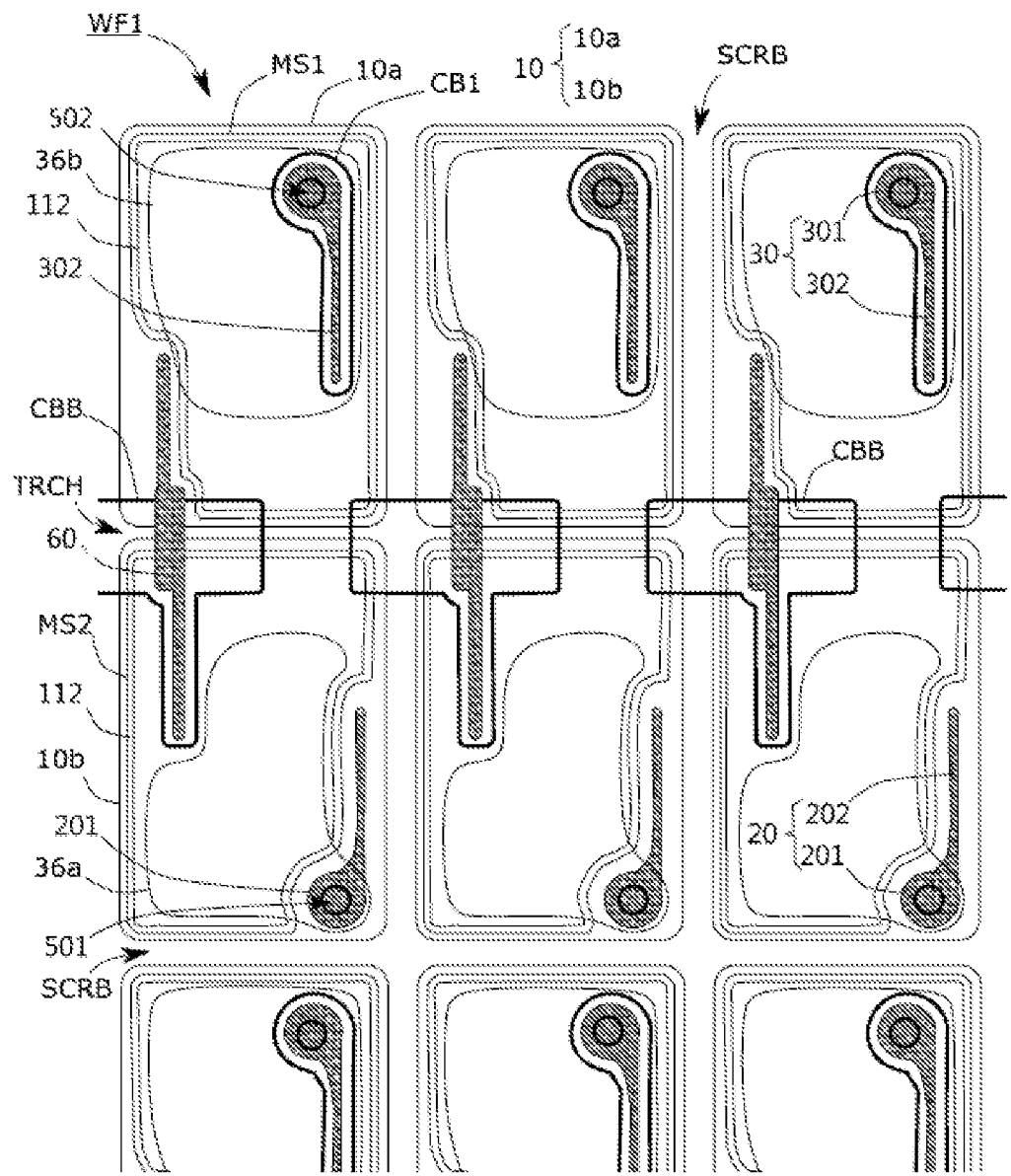

Referring to FIG. 3H and FIG. 4G, the first pad 36a and the second pad 36b are formed on the insulating structure 50. The first pad 36a is formed on the light emitting unit 10b and is electrically connected to the first electrode 20 through the opening 501. The second pad 36b is formed on the light emitting unit 10a and is electrically connected to the second electrode 30 through the opening 502. In an embodiment, the first pad 36a and the second pad 36b are used to connect to a circuit on a carrier board (not shown) to achieve connection with the external power supply or the external electronic components. In another embodiment, the first pad 36a and the second pad 36b can be omitted, and the first electrode 20 and the second electrode 30 can connect to the external power supply or the external electronic components.

Figure 4H:
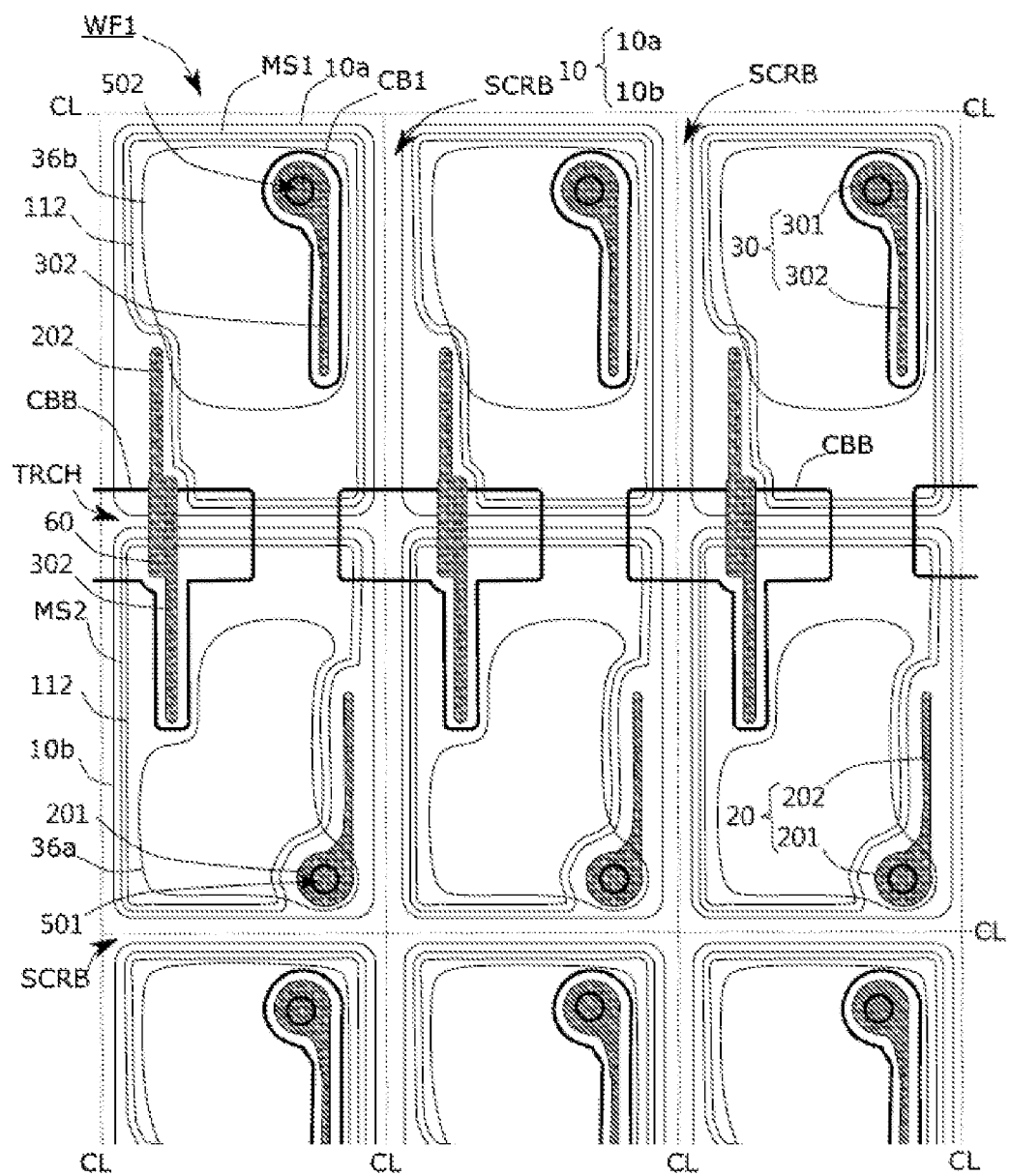

Next, as shown in FIG. 4H, the dicing separation process is performed on the wafer WF1. In this step, the wafer WF1 is divided into the plurality individual light emitting devices 1 by scribing along the scribe line SCRB around each light emitting device by a predetermined cutting line CL. In an embodiment, a laser is irradiated form the bottom surface of the substrate 102 and focused on the interior of the substrate 102 to form a metamorphic region (not shown) in the substrate 102 corresponding to the position of the predetermined cutting line CL or the positions of both sides of the predetermined cutting line CL, and then an external force is applied to cause the metamorphic region form cracks along the crystal plane of the substrate 102. The substrate 102 along with the insulating structure 50 is separated to form the plurality of light emitting devices 1.

FIG. 1 and FIG. 2 show the light emitting device 1 divided from FIG. 4H. After the dicing separation process, the light emitting device 1 has four edges CE1, CE2, CE3 and CE4. The edge CE1 is opposite to the edge CE3, and the edge CE2 is opposite to the edge CE4. In this embodiment, the edges of the light emitting device 1 are defined by the edges of the substrate 102.

It can be seen from FIG. 1 and FIG. 2 that the light emitting device 1 is formed by electrically connecting two light emitting units 10 (10a, 10b) in series. The connection electrode 60 in FIG. 1 partially overlaps the light emitting units 10a and 10b, and crosses the trench TRCH between the light emitting units 10a and 10b to electrically connect the light emitting units 10a and 10b in series. The second electrode 30 serves as the anode of the light emitting device 1 and has the second contact portion 301 and the second extension portion 302. The first electrode 20 serves as the cathode of the light emitting device 1 and has the first contact portion 201 and the first extension portion 202. In this embodiment, the light emitting device 1 includes two light emitting units 10. In an embodiment, the light emitting device 1 may include more light emitting units 10 connected in series and/or in parallel. In another embodiment, the first electrode 20 does not have the first extension portion 202 and/or the second electrode 30 does not have the second extension portion 302.

Before the wafer WF1 is divided into individual light emitting devices 1, as shown in FIG. 4H, the current blocking patterned structure CBB crosses the scribe line SCRB and is on two adjacent light emitting devices 1. The current blocking patterned structure CBB contacts the top surface 182 of the substrate 102 in the scribe line SCRB to be a cross-border current blocking patterned structure. Then, in the dicing separation process, not only the substrate 102 is cut along the scribe line SCRB, but also the current blocking patterned structure CBB is cut. After the dicing separation process is performed, the top surface 182 of the substrate 102 has a periphery region surrounding the light emitting units 10a and 10b in the top view of the light emitting device 1 as shown in FIG. 1. In an embodiment, the periphery region surrounds the semiconductor stack in the top view of the light emitting device 1 as shown in FIG. 1.

In this embodiment, in the wafer WF1, the trench TRCH around each light emitting device 1 is used as the scribe line SCRB, and the bottom of the trench TRCH is the top surface 182 of the substrate 102. As shown in FIG. 1, the current blocking patterned structure CBB remains on the light emitting device 1 as the current blocking patterned structure CB2, and the other current blocking patterned structure CBB remains on the light emitting device 1 as the current blocking patterned structure CB3. The current blocking patterned structures CB2, CB3 are on the periphery region. It can be seen from FIG. 1 that the current blocking patterned structure CB2 and the substrate 102 share the edge CE3, and the current blocking patterned structure CB3 and the substrate 102 share the edge CE1. That is, the current blocking patterned structure CB2 is approximately flush with the edge CE3, and the current blocking patterned structure CB3 is approximately flush with the edge CE1. In other words, in a cross-sectional view of this embodiment, a side wall of the current blocking patterned structure CB2 or CB3 and a side wall of the edge CE3 or CE1 are connected. In an embodiment, the side wall of the current blocking patterned structure CB2 or CB3 and the side wall of the edge CE3 or CE1 are connected and are coplanar. In another embodiment, the current blocking patterned structures CB2, CB3 are on the periphery region, an edge of the current blocking patterned structure CB2 is adjacent to the edge CE3, an edge of the current blocking patterned structure CB3 is adjacent to the edge CE1, and one of the current blocking patterned structures CB2, CB3 is not flush with its adjacent edge while the other of the current blocking patterned structures CB2, CB3 is flush with its adjacent edge. In another embodiment, the current blocking patterned structures CB2, CB3 are not flush with their adjacent edge. For example, the side wall of the current blocking patterned structure CB2 and the side wall of the edge CE3 are not connected.

The current blocking patterned structures CB2, CB3 are respectively formed on the trench TRCH between the light emitting units 10. The current blocking patterned structure CB2 overlaps the connection electrode 60 and from a top view, a width of the current blocking patterned structure CB2 is larger than a width of the connection electrode 60. When the light emitting units 10 are electrically connected, the current blocking patterned structure CB2 is used to ensure the insulation between the connection electrode 60 and the side wall of the semiconductor stack of the light emitting unit 10 in order to prevent the connection electrode 60 and the first extension portion 202, the second extension portion 302 connected thereto from short-circuiting the first semiconductor layer 104 in the light emitting unit 10b. The current blocking patterned structure CB3 does not overlap with any electrodes.

Referring to FIG. 4C, the current blocking patterned structure CBB crosses the scribe line SCRB to prevent the mistaken connection of the connection electrode 60 and the light emitting unit 10 from short-circuiting due to over-etching when patterning the insulative layer to form the current blocking patterned structure. In an embodiment, the method of patterning the insulative layer may be wet etching using an etching solution to remove the insulative layer that is not protected by the photoresist so the remaining insulative layer forms the current blocking patterned structures CBB, CB1. However, in the conventional technology, during the wet etching of the insulative layer, the etching rate of the insulative layer in the predetermined cutting line and the trench is faster than that of the insulative layer on the semiconductor stack, so over-etching occurs easily. Therefore, the portion of the insulative layer that supposes to be retained, such as the portion from the predetermined boundary of the current blocking patterned structure along the trench and the predetermined cutting line, is partially removed. If over-etching occurs, the insulative layer in the predetermined cutting line and the trench may disappear so that the area covered by the current blocking patterned structure is shrunk from the predetermined range and the electrical insulation between the connection electrode and the light emitting unit near the trench cannot be ensured. Hence, the connection electrode is mistakenly short-circuited to the first semiconductor layer of the light emitting unit. The problem is more likely to occur when the connection electrode is closer to the edge of the light emitting device, that is, the closer the predetermined boundary of the current blocking patterned structure under the connection electrode to the predetermined cutting line, the higher the possibility of this problem. After the individual light emitting device 1 is completed, the current blocking patterned structure CB2 can properly electrically isolate the connecting electrode 60 from the light emitting units 10a, 10b.

Since the current blocking patterned structure CBB extends across the scribe line SCRB to another light emitting device 1, the current blocking patterned structure CB3 remains on each light emitting device 1 after cutting. The current blocking patterned structure CB3 does not overlap with any electrodes, that is, the current blocking patterned structure CB3 does not have any electrodes thereon. The current blocking patterned structure CB3 and the substrate 102 share the edge CE1.

Second Embodiment

Figure 5:
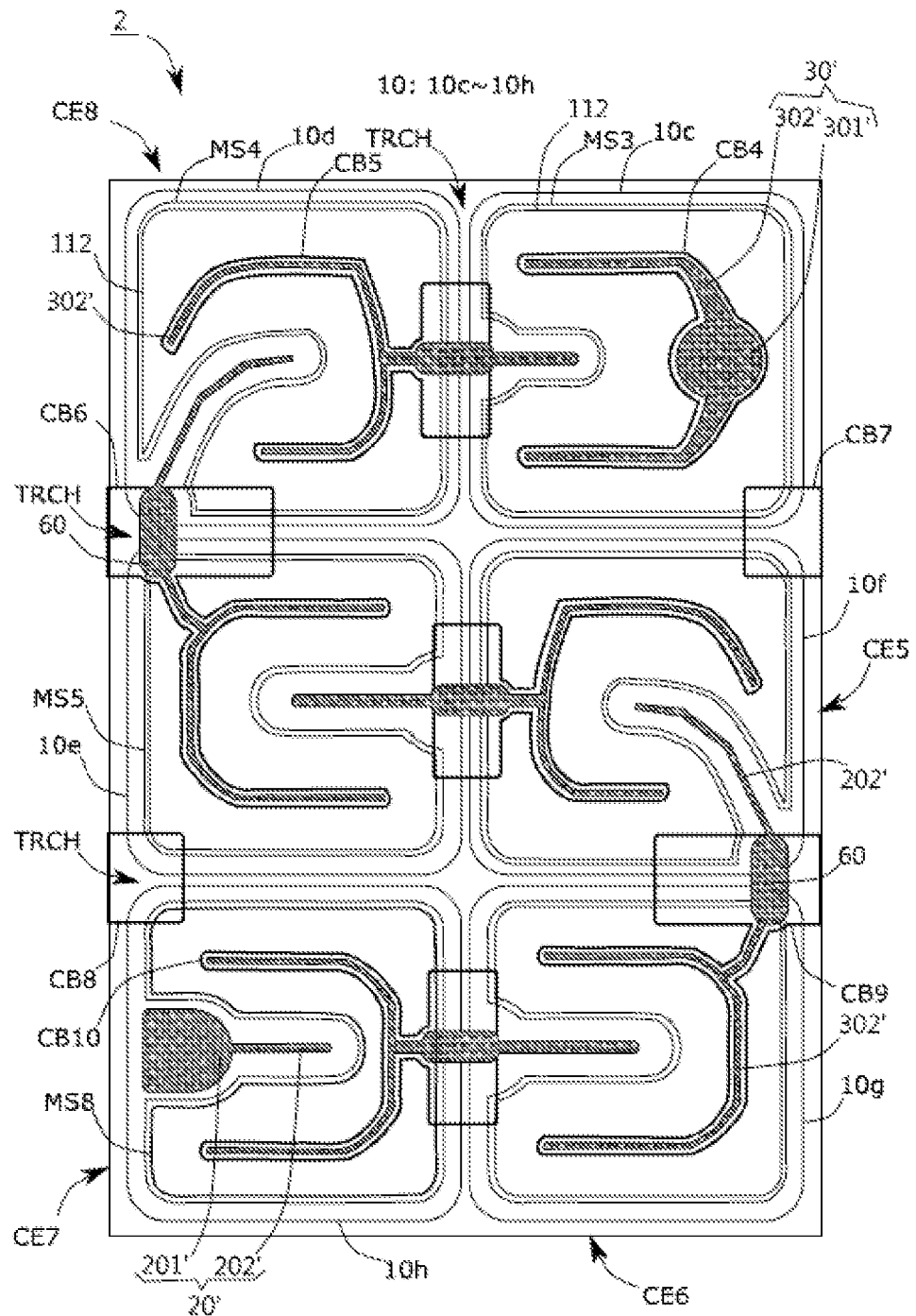
FIG. 5 shows a top view of the light emitting device 2 in accordance with the second embodiment of the present application.
Figure 6:
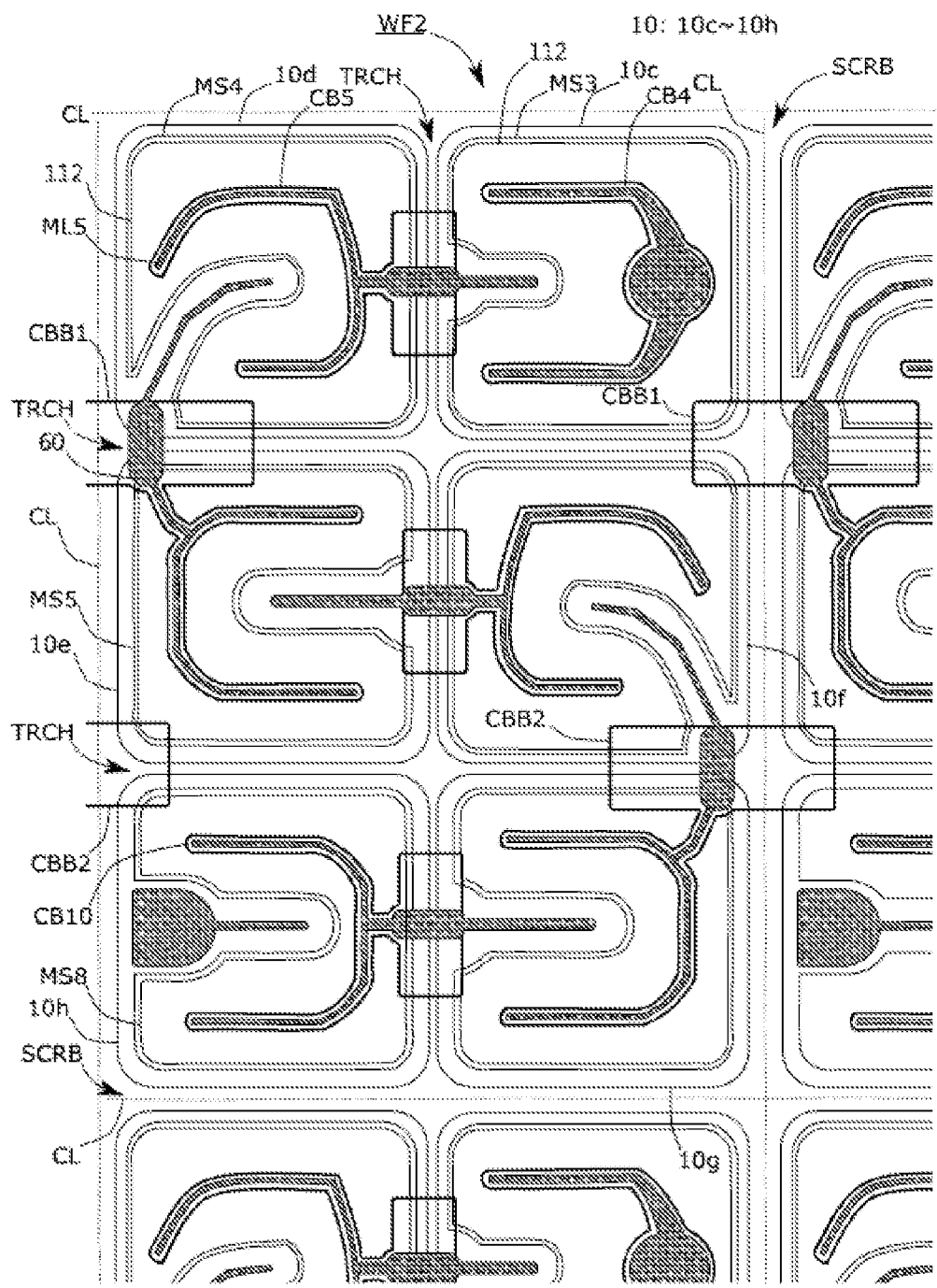
FIG. 6 shows a top view of the light emitting device 2 in the wafer WF2 before cutting.

FIG. 5 shows a top view of the light emitting device 2 in accordance with the second embodiment of the present application. Unlike the light emitting device 1, the light emitting device 2 includes six light emitting units 10 (10c-10h) connected in series in a 2×3 matrix. FIG. 6 shows a top view of the light emitting device 2 in the wafer WF2 before cutting. After cutting along the predetermined cutting line CL in the scribe line SCRB, a plurality of light emitting devices 2 in FIG. 5 could be generated. FIG. 5 and FIG. 6 exemplarily show mesas MS3, MS4, MS5, MS8, current blocking patterned structures CB4, CB5, CB6, CB7, CB8, CB9, CB10, CBB1, CBB2, a transparent conductive layer 112, a first electrode 20', a second electrode 30', a connection electrode 60, a predetermined cutting line CL, a scribe line SCRB, a trench TRCH. The light emitting device 2 includes four edges CE5, CE6, CE7, CE8. Although not all elements are marked with numerals, those skilled in the art can infer according to the teaching of the light emitting device 1 of the present application.

In this embodiment, the first electrode 20' formed on the light emitting unit 10h includes a first contact portion 201' and a first extension portion 202, and the second electrode 30' formed on the light emitting unit 10c includes a second contact portion 301' and a second extension 302'. In another embodiment, the first electrode 20' formed on the light emitting unit 10h does not include the first extension portion 202, and/or the second electrode 30' formed on the light emitting unit 10c does not include the second extension 302'. The first contact portion 201' and the second contact portion 301' can be used for wiring bonding to connect the light emitting device 2 to an external power supply or external components.

As shown in FIG. 5, the light emitting device 2 includes four edges CE5, CE6, CE7, CE8 and six light emitting units 10 connected in series in a 2×3 matrix. The edge CE5 is opposite to the edge CE7, and the edge CE6 is opposite to the edge CE8. In this embodiment, the edges CE5, CE6, CE7, CE8 of the light emitting device 2 are defined by the edges of the substrate 102. The current blocking patterned structures CB7, CB9 are approximately flush with the edge CE5, and the current blocking patterned structures CB6, CB8 are approximately flush with the edge CE7. In another embodiment, The top surface 182 of the substrate 102 has a periphery region surrounding the light emitting units 10c-10h in the top view of the light emitting device 2 as shown in FIG. 5. In an embodiment, the periphery region surrounds the semiconductor stack in the top view of the light emitting device 2 as shown in FIG. 5. The current blocking patterned structures CB6, CB7, CB8, CB9 are on the periphery region, an edge of the current blocking patterned structure CB7 and an edge of the current blocking patterned structure CB9 are adjacent to the edge CE5, but not flush with the edge CE5, and an edge of the current blocking patterned structure CB6 and an edge of the current blocking patterned structure CB8 are adjacent to the edge CE7, but not flush with the edge CE7.

In FIG. 6, the current blocking patterned structures CBB1, CBB2 on the wafer WF2 are cross-border current blocking patterned structures, each of which crosses the scribe line SCRB. Therefore, after cutting the wafer WF2, the current blocking patterned structure CB7 in FIG. 5 is formed by a part of the current blocking patterned structure CBB1, and the current blocking patterned structure CB6 is formed by another part of the current blocking patterned structure CBB1. Similarly, the current blocking patterned structure CB9 in FIG. 5 is formed by a part of the current blocking patterned structure CBB2, and the current blocking patterned structure CB8 is formed by another part of the current blocking patterned structure CBB2.

As shown in FIG. 5, the current blocking patterned structures CB7, CB8 do not overlap with any electrodes, that is, the current blocking patterned structures CB7, CB8 do not have any electrodes thereon. The current blocking patterned structure CB6 crosses the trench TRCH between the light units 10d, 10e, and the current blocking patterned structure CB7 crosses the trench TRCH between the light units 10c, 10f. The current blocking patterned structures CB8, CB9 also cross the trench TRCH between the adjacent light units 10 respectively. In another embodiment, a surface opposite to the top surface 182 of the substrate 102, that is, the bottom surface of the substrate 102, includes a reflective layer (not shown) formed thereon. The materials of the reflective layer may be metal or insulating material, such as a distributed Bragg reflector including alternate stacks of insulating materials with different refractive indexes. The reflective layer may also include an Omni-Directional reflector (ODR) formed by a distributed Bragg reflector and a metal layer.

Similar to the light emitting device 1, the current blocking patterned structures CBB1, CBB2 of the light emitting device 2 can avoid the short-circuiting problem caused by the mistaken connection of the connection electrode 60 and the light emitting unit 10 due to over-etching when forming the current blocking patterned structures CB6, CB9. For example, the connection electrode 60 causes short circuit between the light emitting unit 10d and the first semiconductor layer 104 of the emitting unit 10e by mistakenly connected.

In another embodiment (not shown in the drawings), which is different from the light emitting devices 1, 2 of the previous embodiments using the trench TRCH between the light emitting devices as the scribe line SCRB in the wafers, is described in the following. In the manufacturing process of the light emitting device, the trench TRCH is not formed between the light emitting devices as the scribe line SCRB. Instead, the first semiconductor layer 104 of each light emitting device is connected and the first semiconductor layer 104 connected between the adjacent light emitting devices reserves a region with a predetermined width as the scribe line SCRB. The current blocking patterned structures across the scribe line SCRB (such as CBB, CBB1 and CBB2 of the previous embodiments) are formed in the scribe line SCRB on the first semiconductor layer 104 connected between the adjacent light emitting devices. In the dicing separation process, the current blocking patterned structures, the first semiconductor layer and the substrate are cut along the scribe line SCRB by the predetermined cutting line CL to divide the light emitting devices. The edge of the current blocking patterned structure after cutting and the edge of the first semiconductor layer 104 are flush with and the edge of the light emitting device. Or, from a cross-sectional view, the side wall of the current blocking patterned structure, the side wall of the first semiconductor layer 104 and the side wall of the substrate 102 are connected and are coplanar, or not coplanar.

Third Embodiment

Figure 7:
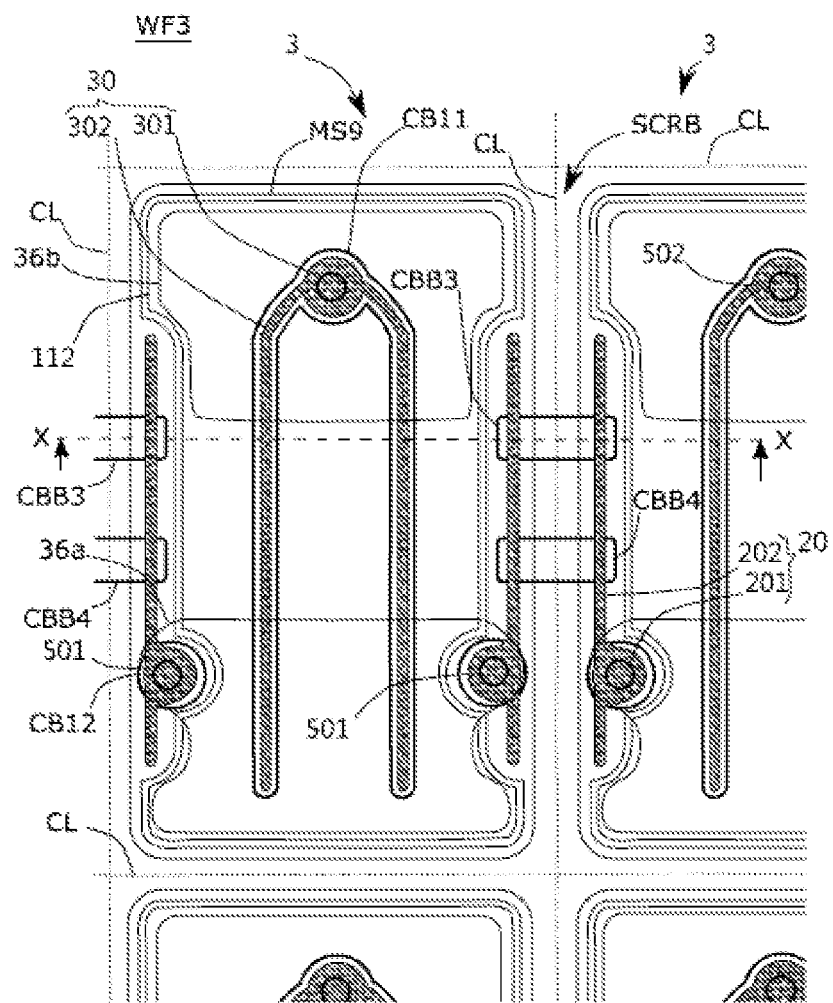
FIG. 7 shows a top view of the light emitting device 3 in accordance with the third embodiment of the present application in the wafer WF3 before cutting.
Figure 8A:
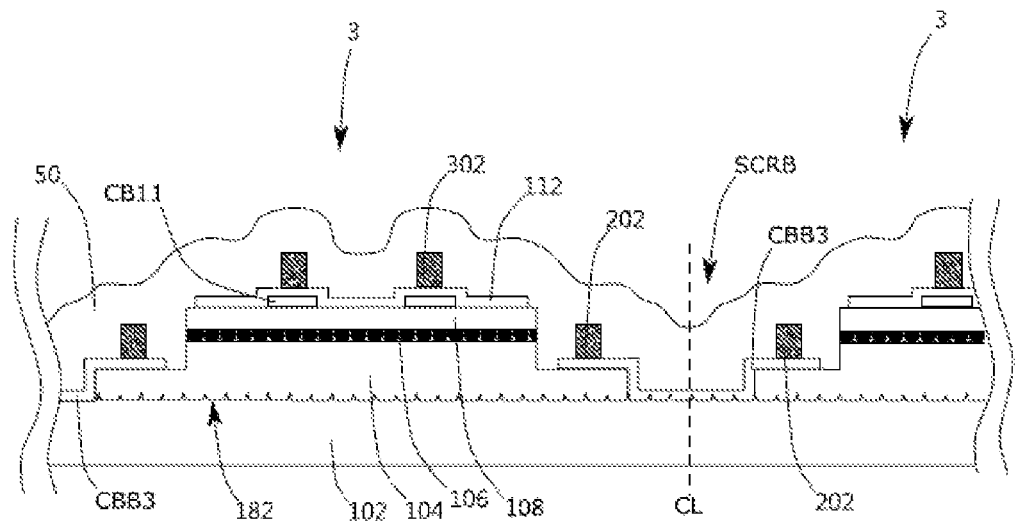
FIG. 8A shows a cross-sectional view along the cross-section line X-X' shown in FIG. 7.

The present application is not limited to the light emitting device having LED series/parallel arrays, but also can be applied to the light emitting device having a single light emitting unit, such as the light emitting device 3 of another embodiment of the present application. FIG. 7 shows a top view of the light emitting device 3 in accordance with the third embodiment of the present application in the wafer WF3 before cutting. After cutting along the scribe line SCRB by the predetermined cutting line CL, the plurality of light emitting devices 3 are formed. As shown in FIG. 7, the region surrounded by the predetermined cutting line CL is a top view of the light emitting device 3. FIG. 8A shows a cross-sectional view along the cross-section line X-X' shown in FIG. 7.

As shown in FIG. 7 and FIG. 8A, the light emitting device 3 include a substrate 102, a first semiconductor layer 104, an active layer 106 and a second semiconductor layer 108 sequentially formed on the substrate 102, mesa MS9, current blocking patterned structures CB11, CB12, CBB3, CBB4, a transparent conductive layer 112, a first electrode 20, a second electrode 30, an insulating structure 50, a first pad 36a and a second pad 36b. Similar to the light emitting device 1, the area outside the mesa MS9 exposes a top surface of the first semiconductor layer 104, the first electrode 20 is formed on the first semiconductor layer 104 and includes a first contact portion 201 and a first extension portion 202. The current blocking patterned structure CB11 is formed on the second semiconductor layer 108. The transparent conductive layer 112 is formed on the current blocking patterned structure CB11 and the second semiconductor layer 108. The second electrode 30 is formed on the transparent conductive layer 112 and includes a second contact portion 301 and a second extension portion 302. The insulating structure 50 covers the mesa MS9, the scribe line SCRB and the first semiconductor layer 104, and includes openings 501, 502 respectively corresponding to the first contact portion 201 and the second contact portion 301. The first pad 36a is formed on the insulating structure 50 and is electrically connected to the first semiconductor layer 104 through the opening 501. The second pad 36b is formed on the insulating structure 50 and is electrically connected to the second semiconductor layer 108 through the opening 502. The first pad 36a and the second pad 36b of the light emitting device 3 are used to connect to a circuit on a carrier board (not shown) to achieve connection with an external power supply or external electronic components. The structure, material and manufacturing process of each layer of the light emitting device 3 can be taught by the description of the light emitting device 1 in the previous embodiment, and not be repeated here.

In this embodiment, the first electrode 20 is formed along two opposite sides of the light emitting device 3, that is, along the scribe line SCRB on both sides of the light emitting device 3. The current blocking patterned structure CB12 is under the first contact portion 201, and the current blocking patterned structures CBB3, CBB4 are under the first extension portion 202 separately. The current blocking patterned structures CB12, CBB3, CBB4 isolate the first electrode 20 from contacting the first semiconductor layer 104 so that the first electrode 20 contacts the first semiconductor layer 104 at intervals to increase the current spreading effect. In addition, when the active layer 106 irradiates the current blocking patterned structures CB12, CBB3, CBB4, the refractive index of the material of the current blocking patterned structures CB12, CBB3, CBB4 provide a path for extracting light to reduce the absorption of light by the first electrode 20.

As the previous embodiments show, in the manufacturing process of the light emitting device 3, a trench is formed between the light emitting devices 3 in the wafer WF3 to serve as the scribe line SCRB, and then each light emitting device 3 is divided along the scribe line SCRB by the predetermined cutting line CL. The light emitting device 3 has a periphery region surrounding the light emitting device 3, wherein the periphery region is formed by the top surface 182 of the substrate 102 exposed around the light emitting device 3. In an embodiment, the periphery region surrounds the semiconductor stack in the top view of the light emitting device 3. However, during patterning the insulative layer to form the current blocking patterned structures, the etching rate of the insulative layer in the predetermined cutting line and the trench is faster than that of the insulative layer on the semiconductor stack, so over-etching occurs easily. When over-etching occurs, the boundary of the current blocking patterned structure may shrink inside the first extension portion 202, so that the area where the current blocking patterned structures previously isolated the first electrode 20 form contacting the first semiconductor layer 104 becomes the first electrode 20 partially or fully contacting the first semiconductor layer 104. The current spreading and the light output of the light emitting device 3 are affected. In this embodiment, the current blocking patterned structures CBB3, CBB4 cross the scribe line SCRB and cover the top surface 182 of the substrate 102 to prevent the boundary of the current blocking patterned structures CBB3, CBB4 from being beneath the electrode caused by over-etching so the impact of the photoelectric characteristics of the light emitting device 3 can be reduced. Therefore, after the dicing separation process is performed and the individual light emitting device 3 is formed, the current blocking patterned structures CBB3, CBB4 extend from below the first extension portion 202 to cover the side wall of the first semiconductor layer 104 and the top surface 182 of the substrate 102, as shown in FIG. 8A. In addition, as the previous embodiment of the light emitting device 1 shows, the current blocking patterned structures CBB3, CBB4 are on the periphery region after the dicing separation process is performed, and the edges of the current blocking patterned structures CBB3, CBB4 are flush with the edge of the light emitting device 3. Or, a side wall of the current blocking patters CBB3, CBB4 and a side wall of the substrate 102 are connected in a cross-sectional view, and the side wall of the current blocking patterned structures CBB3, CBB4 and the side wall of the substrate 102 are coplanar or non-coplanar. In this embodiment, the edges of the light emitting device 3 are defined by the edges of the substrate 102. In another embodiment, the current blocking patterned structures CBB3, CBB4 are on the periphery region after the dicing separation process is performed, and the edges of the current blocking patterned structures CBB3, CBB4 are not flush with the edges of the light emitting device 3.

Figure 8B:
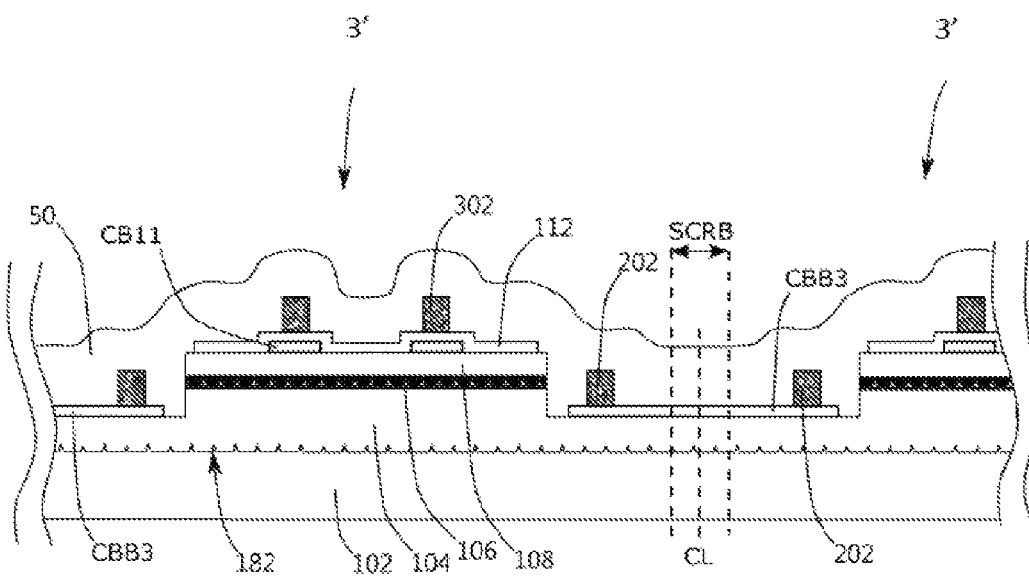
FIG. 8B shows a cross-sectional view along the cross-section line X-X' shown in FIG. 7 in accordance with another embodiment of the present application.

FIG. 8B shows a cross-sectional view along the cross-section line X-X' shown in FIG. 7 in accordance with another embodiment of the present application. The difference between FIG. 8B and FIG. 8A is that the scribe line SCRB around the light emitting devices 3' in FIG. 8B is not formed by the trench TRCH. Instead, the first semiconductor layer 104 of each light emitting device 3' is connected and the first semiconductor layer 104 connected between the adjacent light emitting devices 3' reserves a region with a predetermined width as the scribe line SCRB. The current blocking patterned structures CBB3, CBB4 are formed in the scribe line SCRB on the first semiconductor layer 104 connected between the adjacent light emitting devices 3' and the first electrode 20 is formed on the current blocking patterned structures CBB3, CBB4. In the dicing separation process, the current blocking patterned structure CBB3, the first semiconductor layer 104, and the substrate 102 are cut along the scribe line SCRB with a predetermined cutting line to separate the light emitting devices 3'. The top surface 182 of the substrate 102 has a periphery region surrounding the light emitting device 3' in the top view of the light emitting device 3'. In an embodiment, the periphery region surrounds the semiconductor stack in the top view of the light emitting device 3'. After the dicing separation process, the current blocking patterned structures CBB3, CBB4 are on the periphery region and the edges of the current blocking patterned structures CBB3, CBB4 are flush with the edge of the first semiconductor layer 104 and the edge of the light emitting device 3'. For example, a side wall of the current blocking patterned structures CBB3 or CBB4, a side wall of the first semiconductor layer 104, and a side wall of the substrate 102 are connected in a cross-sectional view, and the side wall of the current blocking patterned structures CBB3 or CBB4, the side wall of the first semiconductor layer 104 and the side wall of the substrate 102 are coplanar or non-coplanar.

It will be apparent to those having ordinary skill in the art that various modifications and variations can be made to the devices in accordance with the present application without departing from the scope or spirit of the disclosure. In view of the foregoing, it is intended that the present application covers modifications and variations of this disclosure provided they fall within the scope of the following claims and their equivalents.

What is claimed is:

1. A light emitting device, comprising:
   a substrate, comprising a top surface and a boundary in a top view of the light emitting device, wherein the boundary comprises a first edge, and a second edge opposite to the first edge;
   a semiconductor stack formed on the substrate, wherein the semiconductor stack comprises a plurality of light emitting units, wherein the plurality of light emitting units comprises a first light emitting unit and a second light emitting unit, each of the first light emitting unit and the second light emitting unit comprises a first semiconductor layer formed on the substrate, a second semiconductor layer formed on the first semiconductor layer and an active layer interposed between the first semiconductor layer and the second semiconductor layer;

a trench formed between the first light emitting unit and the second light emitting unit, and exposing the top surface of the substrate, wherein the trench extends along a direction perpendicular to first edge;

a first current blocking patterned structure and a second current blocking patterned structure formed in the trench, and separated from each other in the top view of the light emitting device; and a plurality of electrodes formed on the first light emitting unit and the second light emitting unit, and electrically connected to the first light emitting unit and the second light emitting unit, wherein the plurality of electrodes comprises a connection electrode comprising:
  a connection portion formed on the trench;
  a first extension portion extending along the first edge, formed on and electrically connected to the first semiconductor layer of the first light emitting unit; and
  a second extension portion extending along the first edge, formed on and electrically connected to the second semiconductor layer of the second light emitting unit, wherein the connection portion connects the first extension portion and the second extension portion, wherein the first extension portion, the second extension portion, and the connection portion respectively comprises a first width, a second width and a third width in the direction perpendicular to the first edge, wherein the third width is greater than the first width and the second width in the top view of the light emitting device;

wherein the first current blocking patterned structure is overlapped with the connection portion and the second current blocking patterned structure is not overlapped with the plurality of electrodes in the top view of the light emitting device.

2. The light emitting device of claim 1, wherein each adjacent two of the plurality of light emitting units are separated from each other by the trench.

3. The light emitting device of claim 1, further comprising a current blocking extending portion extending from the first current blocking patterned structure to the second semiconductor layer of the second light emitting unit, wherein the light emitting device further comprises a transparent conductive layer formed between the first current blocking patterned structure and the second extension portion.

4. The light emitting device of claim 1, wherein an area of the first current blocking patterned structure is larger than that of the second current blocking patterned structure in the top view of the light emitting device.

5. The light emitting device of claim 1, wherein the top surface comprises a periphery region surrounding and exposed by the semiconductor stack in the top view of the light emitting device, and wherein the first current blocking patterned structure and the second current blocking patterned structure are formed on the periphery region.

6. The light emitting device of claim 1, wherein the substrate comprises a first side wall and a second side wall, wherein the first side wall connects the top surface at the first edge, and the second side wall connects the top surface at the second edge, wherein each of the first current blocking patterned structure and the second current blocking patterned structure comprises a side wall, and wherein in a cross-sectional view of the light emitting device, the first side wall of the substrate and the side wall of the first current blocking patterned structure are connected, and the second side wall of the substrate and the side wall of the second current blocking patterned structure are connected.

7. The light emitting device of claim 1, further comprising an insulating structure formed on the first light emitting unit, the second light emitting unit, the plurality of electrodes and the trench.

8. The light emitting device of claim 1, wherein the boundary comprises a third edge connecting the first edge and the second edge, wherein a length of the first edge is greater than a length of the third edge, wherein the first current blocking patterned structure is adjacent to the first edge, and the second current blocking patterned structure is adjacent to the second edge.

9. A light emitting device, comprising:
  a substrate comprising a boundary, wherein the boundary comprises a first edge, a second edge opposite to the first edge, and a third edge connecting the first edge and the second edge, wherein a length of the first edge is greater than a length of the third edge in a top view of the light emitting device;
  a semiconductor stack formed on the substrate, wherein the semiconductor stack comprises a first side and a second side extending along the first edge and the second edge respectively, and a third side connected with the first side and the second side, which extends along the third edge;
  a first current blocking patterned structure and a second current blocking patterned structure formed on the first side and the second side of the semiconductor stack respectively and separated from each other in the top view of the light emitting device, wherein the first current blocking patterned structure is adjacent to the first edge, and the second current blocking patterned structure is adjacent to the second edge; and
  an electrode formed on the semiconductor stack, and formed on and contact with the first current blocking patterned structure;
  wherein the first current blocking patterned structure comprises a first side wall flush with the first edge and a third side wall opposite to the first side wall, and the second current blocking patterned structure comprises a second side wall flush with the second edge and a fourth side wall opposite to the second side wall in the top view of the light emitting device, wherein the third side wall is opposite to and facing to the fourth side wall.

10. The light emitting device of claim 9, wherein the substrate comprises a top surface, a fifth side wall and a sixth side wall, wherein the fifth side wall connects the top surface at the first edge, and the sixth side wall connects the top surface at the second edge, and wherein in a cross-sectional view of the light emitting device, the fifth side wall of the substrate and the first side wall of the first current blocking patterned structure are connected, and the sixth side wall of the substrate and the second side wall of the second current blocking patterned structure are connected.

11. The light emitting device of claim 9, wherein the substrate comprises a top surface, wherein the top surface comprises a periphery region surrounding and exposed by the semiconductor stack in the top view of the light emitting device, and wherein the first current blocking patterned structure and the second current blocking patterned structure are formed on the periphery region.

12. The light emitting device of claim 9, further comprising a trench on the substrate, wherein the semiconductor stack comprises a plurality of light emitting units formed on the substrate and separated from each other by the trench, wherein the first current blocking patterned structure and the second current blocking patterned structure are formed in the trench, wherein the plurality of light emitting units comprises a first light emitting unit and a second light emitting unit, and wherein the electrode is electrically connected to the first light emitting unit and the second light emitting unit.

13. The light emitting device of claim 9, wherein the first current blocking patterned structure is overlapped with the electrode and the second current blocking patterned structure is not overlapped with the electrode in the top view of the light emitting device.

14. The light emitting device of claim 13, wherein the electrode extends along the first edge in the top view of the light emitting device.

15. A light emitting device, comprising:
a substrate comprising a top surface, a first edge, a second edge opposite to the first edge, and a third edge connecting the first edge and the second edge, wherein a length of the first edge is greater than a length of the third edge;
a semiconductor stack formed on the top surface, and exposing a periphery region of the top surface of the substrate surrounding the semiconductor stack, wherein the semiconductor stack comprises a continuous first semiconductor layer that is continuous on the substrate, and a mesa formed on a first portion of the continuous first semiconductor layer, wherein the mesa comprises a second semiconductor layer formed on the continuous first semiconductor layer, and an active layer interposed between the continuous first semiconductor layer and the second semiconductor layer, wherein the continuous first semiconductor layer comprises a continuous second portion that is continuous on the substrate and exposed by the mesa, and wherein the mesa comprises a side wall connecting to the second portion adjacent to the first edge;
a first current blocking patterned structure and a second current blocking patterned structure separately formed on and partially covering the continuous second portion of the continuous first semiconductor layer and the periphery region, wherein the first current blocking patterned structure and the second current blocking patterned structure are adjacent to the first edge; and
a first electrode formed on and contact with the first current blocking patterned structure and the second current blocking patterned structure, wherein the first electrode extends along the first edge;
wherein the first current blocking patterned structure and the second current blocking patterned structure respectively comprises a first side wall and a second side wall facing to and spaced apart from the side wall of the mesa in a cross-sectional view of the light emitting device.

16. The light emitting device of claim 15, wherein the substrate comprises a fifth side wall, wherein the fifth side wall connects the top surface at the first edge, wherein the first current blocking patterned structure and the second current blocking patterned structure respectively comprises a third side wall and a fourth side wall, and wherein in a cross-sectional view of the light emitting device, the fifth side wall of the substrate and the third side wall of the first current blocking patterned structure are connected, and/or the fifth side wall of the substrate and the fourth side wall of the second current blocking patterned structure are connected.

17. The light emitting device of claim 15, further comprising a third current blocking patterned structure adjacent to the second edge, and a second electrode formed on the third current blocking patterned structure, wherein the third current blocking patterned structure covers the periphery region and the continuous second portion of the continuous first semiconductor layer partially in a top view of the light emitting device.

18. The light emitting device of claim 15, wherein the first continuous semiconductor layer comprises a side wall, and the first and second current blocking patterned structures cover the side wall of the continuous first semiconductor layer.

19. The light emitting device of claim 17, further comprising a fourth current blocking patterned structure adjacent to the second edge, wherein the second electrode is formed on the fourth current blocking patterned structure, wherein the fourth current blocking patterned structure covers the periphery region and the continuous second portion of the continuous first semiconductor layer partially in the top view of the light emitting device, wherein the second electrode extends along the second edge, and the third current blocking patterned structure and the fourth current blocking patterned structure are separately arranged along the second edge in the top view of the light emitting device.

20. The light emitting device of claim 19, wherein the first and second current blocking patterned structures are flush with the first edge, and/or the third and fourth current blocking patterned structures are flush with the second edge.

* * * * *